US006150969A

United States Patent [19]
Melanson

[11] Patent Number: 6,150,969
[45] Date of Patent: Nov. 21, 2000

[54] CORRECTION OF NONLINEAR OUTPUT DISTORTION IN A DELTA SIGMA DAC

[75] Inventor: John Laurence Melanson, Boulder, Colo.

[73] Assignee: AudioLogic, Incorporated, Boulder, Colo.

[21] Appl. No.: 09/163,235

[22] Filed: Sep. 29, 1998

Related U.S. Application Data

[63] Continuation-in-part of application No. 08/662,873, Jun. 12, 1996, Pat. No. 5,815,102.

[51] Int. Cl.[7] .................................................. H03M 3/00
[52] U.S. Cl. ............................................. 341/143; 341/144
[58] Field of Search .................................. 341/143, 144, 341/152, 131, 77, 53

[56] References Cited

U.S. PATENT DOCUMENTS

| 5,327,133 | 7/1994 | Greene | 341/143 |
| 5,548,286 | 8/1996 | Craven | 341/126 |
| 5,708,433 | 1/1998 | Craven | 341/144 |
| 5,784,017 | 7/1998 | Craven | 341/126 |
| 5,838,272 | 11/1998 | Steiner et al. | 341/143 |

OTHER PUBLICATIONS

"Delta–Sigma Converter Having Linear Conversion Transfer Function Independent of Signal Edge Transition Asymmetry of the Coder," IBM Technical Disclosure Bulletin, US, IBM Corp. New York, vol. 32, No. 6A, Nov. 1, 1989, pp. 391–392, XP000043253. ISSN:0018–8689.

*Primary Examiner*—Howard L. Williams
*Assistant Examiner*—Jean B. Jeanglaude
*Attorney, Agent, or Firm*—Jennifer L. Bales; Macheledt Bales & Johnson LLP

[57] ABSTRACT

A delta sigma modulator of at least second order includes correction means applied to each feedback loop in the modulator, to account for systemic nonlinear output distortions. Since the output distortion is nonlinear, the correction applied to each feedback loop is nontrivially different. Such a corrected delta sigma modulator may be used in a demodulator including an output digital to analog converter (DAC) to account for systemic imperfections in the pulses formed by the DAC. The corrected delta sigma modulator is also useful in correcting output errors associated with high quality multilevel demodulators and class D power amplifiers. The corrected delta sigma modulator may be one bit or multilevel.

13 Claims, 32 Drawing Sheets

```
/******************************************************************
 * C program to simulate a noise shaped,  PWM digital to analog converter
 *
 * John Melanson, 20 May 1996
 * assumes an input signal, 16 bit signed integer,
 * with + -16* 1024 being the input saturation points
 *
 * The PWM output is operating at 16 times the noise shaping frequency.
 * Uses a noise shaper than can be built with one 3 port adder
 * (two 16 bit inputs, one 10 bit input), and operated in three phases.
 *
 * The delta sigma structure used is especially appropriate,
 * as it operates in three phases, and is very
 * stingy on hardware resources
 *
 * The converter is assumed to be operating at a 250 kHz noise shaped
 * rate, and at a 4mHz output bit rate
 ******************************************************************/
#include <stdio.h>
include <math.h> double fs = 250000.;

// Feedback of quantized output short  fb[17]={
    0x4000,     // 0
    0x3800,     // 1
    0x3000,     // 2
    0x2800,     // 3
    0x2000,     // 4
    0x1800,     // 5
    0x1000,   // 6
    0x0800,     // 7
    0x0000,     // 8
    0xf800,     // 9
    0xf000,     // 10
    0xe800,     // 11
    0xe000,     // 12
    0xd800,     // 13
    0xd000,     // 14
    0xc800,     // 15
    0xc000    // 16
};
```

FIGURE 17A

```c
// Correction factor for second integral. Note that the sign is opposite
//  that of the feedback, as odd output widths are late relative to
//  even output widths
short cor[17]={
    0x0000,     // 0
    0x0040,     // 1
    0x0000,     // 2
    0x00c0,     // 3
    0x0000,     // 4
    0x0140,     // 5
    0x0000,     // 6
    0x01c0,     // 7
    0x0000,     // 8
    0x0240,     // 9
    0x0000,     // 10
    0x02c0,     // 11
    0x0000,     // 12
    0x0340,     // 13
    0x0000,     // 14
    0x03c0,     // 15
    0x0000,     // 16
};
// Rom for duty cycle modulator - pulse
// grows from middle, on right first
//
short out_rom [17] [16] = {
    { -1, -1, -1, -1, -1, -1, -1, -1, -1, -1, -1, -1, -1, -1, -1, -1}, // 0
    { -1, -1, -1, -1, -1, -1, -1, -1,+1, -1, -1, -1, -1, -1, -1, -1}, // 1
    { -1, -1, -1, -1, -1, -1, -1,+1,+1, -1, -1, -1, -1, -1, -1, -1}, // 2
    { -1, -1, -1, -1, -1, -1, -1,+1,+1,+1, -1, -1, -1, -1, -1, -1}, // 3
    { -1, -1, -1, -1, -1, -1,+1,+1,+1,+1, -1, -1, -1, -1, -1, -1}, // 4
    { -1, -1, -1, -1, -1, -1,+1,+1,+1,+1,+1, -1, -1, -1, -1, -1}, // 5
    { -1, -1, -1, -1, -1,+1,+1,+1,+1,+1,+1, -1, -1, -1, -1, -1}, // 6
    { -1, -1, -1, -1, -1,+1,+1,+1,+1,+1,+1,+1, -1, -1, -1, -1}, // 7
    { -1, -1, -1, -1,+1,+1,+1,+1,+1,+1,+1,+1, -1, -1, -1, -1}, // 8
    { -1, -1, -1, -1,+1,+1,+1,+1,+1,+1,+1,+1,+1, -1, -1, -1}, // 9
    { -1, -1, -1,+1,+1,+1,+1,+1,+1,+1,+1,+1,+1, -1, -1, -1}, // 10
    { -1, -1, -1,+1,+1,+1,+1,+1,+1,+1,+1,+1,+1,+1, -1, -1}, // 11
    { -1, -1,+1,+1,+1,+1,+1,+1,+1,+1,+1,+1,+1,+1, -1, -1}, // 12
    { -1, -1,+1,+1,+1,+1,+1,+1,+1,+1,+1,+1,+1,+1,+1, -1}, // 13
    { -1,+1,+1,+1,+1,+1,+1,+1,+1,+1,+1,+1,+1,+1,+1, -1}, // 14
    { -1,+1,+1,+1,+1,+1,+1,+1,+1,+1,+1,+1,+1,+1,+1,+1}, // 15
    {+1,+1,+1,+1,+1,+1,+1,+1,+1,+1,+1,+1,+1,+1,+1,+1}, // 16
};
```

FIGURE 17B

```
/************************************************
 *
 *          add_3
 * Emulate a 3 input, 16 bit adder  (the third input, c,
 * needs to be only 10 bits).
 * The adder saturates on overflow and underflow
 *
 ************************************************/
short add_3 (short a, short b, short c) {
    long temp = (long) a + long (b) + long (c);
    if (temp > (signed) 0x00007fffL) return 0x7fff;
    if (temp < (signed) 0xffff8000L) return 0x8000;
    return (short) temp;
} quant

* Quantize a 16 bit value to a number in the range 0 - 16.  Over and
*underflows will produce values of 16 and 0, respectively.  A 0 input
* produces an 8 output, which corresponds to a 50% duty cycle

************************************************/
short quant (short x) {
    if (x >= (signed short) 0x4000) return 16;
    if (x <= (signed short) 0xc000) return 0;
    return (x + 0x4000) >>11;
}
/************************************************
*           insig
*
* Make a test signal, 2 kHz, +- 10000 amplitude.  This function
* would normally be replaced by a signal source
* followed by some kind of sample rate increasing system.
************************************************/
#define testfreq 2000.
#define level 10000.

short insig (long time) {
    return (short) (.5 + level * sin (2 * 3.14159 / fs * testfreq * (long) time));
}
/************************************************
```

FIGURE 17C bias

```
* The output of this routine could be a simple 0x0400, but better
* results are had with a little bit of white noise injected.
* White noise comes from a randome prn
*
**********************************************/
short bias (void) {
    static short r = 1;
    r = (r << 1) | (1 & ((r >>14) ^ (r>>13)) );
//
//  return 0x300, 0x340, 0x380 ... 0x6c0
//
    return ( r & 0x3c0) + 0x300;
}
/*********************************************
            main

* Emulate converter
* Test will run for 500 us, one cycle of the test sine wave
* The three ports of the adder are connected as follows:
*                                    *
* port    phase 0     phase1     phase 2
* a       r0          r0         r0           (hard wired)
* b       input       r1         r1           (require a 2 input mux)
* c       feedback    correction bias         (requires simple logic)
**********************************************
void main (void) {
    short r0 = 0;  // one of the hardware integrations registers
    short r1 = 0;  // the other hardware integration register
    short out = 8; // the previous output duty cycle
    long time;
    FILE *results;

/* open an output file for update */
    results = fopen ("DAC.OUT", "w+");
    fprintf (results, "Output results of DAC simulation - 4mHz rate\n");

for ( time = 0; time < 125; time ++)
```

FIGURE 17D

```
//
// do delta - sigma part
// r0 =       add_3 ( r0, insig (time) , fb [out] );    // phase 0
       r1 =       add_3 ( r0, r1         , cor [out]);    // phase 1
          out= quant( add_3 ( r0, r1         , bias() ) );   // phase 2

//
// Now do duty cycle modulator
// for (int tick = 0; tick < 16; tick++) {
                fprintf (results, "%+4d", out_rom [out] [tick] );
            }
            fprintf (results, "\n") ;
    }
    fclose (results) ;
}
```

FIGURE 17E

Output results of DAC simulation - 4mHz rate

CORRECTION OF NONLINEAR OUTPUT DISTORTION IN A DELTA SIGMA DAC

CROSS REFERENCE TO RELATED APPLICATION

This application is a continuation in part of copending patent application 08/662,873 filed on Jun. 12, 1996 now U.S. Pat. No. 5,815,702 for Delta Sigma PWM DAC to Reduce Switching.

BACKGROUND OF THE INVENTION

1. Field of the Invention

The present invention relates to digital to analog converters (DACs) for audio frequencies. More particularly, this invention relates to correction of nonlinear output distortion in delta sigma DACs.

2. Description of the Prior Art

Delta sigma modulation incorporates a noise-shaping technique whereby the noise of a quantizer (often 1-bit) operating at a frequency much greater than the bandwidth is moved to frequencies not of interest in the output signal. A filter after the quantizer removes the out of band noise. The resulting system synthesizes a high resolution data converter, but is constructed from low resolution building blocks. A good overview of the theory of delta sigma modulation is given in "Oversampling Delta-Sigma Data Converters," by Candy and Temes, IEEE Press, 1992.

FIG. 1 shows a well known first order delta sigma quantizer. The purpose of this quantizer, in a digital to analog (D/A) converter, is to convert a high resolution digital signal xi, 11, having several bits (16 for example) into a single-bit code yi, 12, which can be accurately converted to analog. Input 11 is fed to the quantizer via an integrator 16, and quantized output 12 is fed back as feedback 25 and subtracted using adder 14 from the input. Integrator 16 comprises delay 18, and adder 17, which adds the delayed signal 19 to the signal from adder 14. Quantizer 21 acts as a 1-bit A/D converter, driving its output to a negative one (given a negative input) or a positive one (given a positive input). The quantizer function is modeled as adding the output of integrator 16 to an error signal ei, 23. This modeling allows the calculation of the spectrum of the noise to be done in a straight forward manner.

For large positive inputs, the integrator output will be positive. A logic one is then the output of the quantizer, which is fed back and subtracted from the input. The series of output ones continues until the integrator output, which is ramping down due to the negative feedback, finally crosses the quantizer threshold, when the quantizer outputs a negative one. Over time, the average output yi equals the input xi. The system is called a first order delta sigma converter, because a single integrator stage is used.

FIG. 2 shows how output yi, 31, looks for a sinusoidal input xi, 30. When the input sine wave is at a high level, a large number of ones are generated. When the input sine wave is at a low level, a large number of negative ones are generated.

FIG. 3 shows a common second order delta sigma quantizer. In practice, delta sigma modulators are generally at least second order, because higher order modulators better reduce noise in the signal band, due to improved prediction of the in-band quantization error. Thus, the resulting signal to noise ratio is better. Second order delta sigma modulators are still relatively stable, and easy to design.

Input xi, 35, is added to feedback signal 54 by adder 38. The signal from adder 38 is fed into first accumulator 40, comprising delay 42 and adder 41. The output of accumulator 40 is added to feedback signal 54 and fed into second accumulator 44, comprising delay 47 and adder 45. The output of accumulator 44 goes into quantizer 50, modeled as error signal ei, 52, added to the input by adder 51. Quantized output 36 also feeds back as feedback signal 54. Quantizer 50 may quantize the signal into ones and zeroes (1-bit format) or into multiple levels.

FIG. 4 shows an oversampling digital to analog (D/A) converter, which utilizes a second order delta sigma quantizer 70 and a one-bit D/A converter 71 as the demodulator 69, and a low pass filter 73 to remove the noise from the 1-bit signal. In one specific example of the oversampling D/A converter of FIG. 4, the input signal xi, 60, consists of data encoded into 16 bit words at 8 kHz. These words are placed into a register 63 from which they are fed into a low pass filter 64 at 32 kHz, with each word repeated four times. The low pass filter would typically by of the finite impulse response type. The linear interpolator 66, which is also a low pass filter, inserts three new words between each pair of words from low pass filter 64, which raises the data rate to 128 kHz. These words are fed into a second register 67, which feeds each word into the demodulator 69, repeating each word eight times, resulting in a data rate of 1 MHz. This repeating of the samples is a simple type of low pass filter. The 1 MHz sample rate is a sufficiently high data rate so that the quantization noise which will be introduced into the signal is small, and the requirements of the analog smoothing filter are easily met. Output yi, 61, is an analog signal.

Techniques for increasing the sample rate, generally called interpolation, are well understood by those versed in the art. Most designs will utilize several stages of increase, with each successive stage being simpler in structure, and running at a faster rate.

This sort of demodulator is frequently used in audio applications. The output of demodulator 69 can sometimes be driven directly into a speaker (not shown), because the speaker can act as a low pass filter. This configuration uses what is called class D output. Power dissipation in a class D stage has the potential for being very low, as the output transistors are always in either a fully shorted or open position, removing most resistive power consumption. The remaining power is dissipated by the switching of capacitance, which is equal to $C*V^2*F$. C, the capacitance being switched, is typically set by the parasitic capacitance of the output transducer and of the driver transistors. V, the voltage being switched, is set by the available supplies, and the required audio output. F, the average frequency of the output, can be varied by the designer. As F is made larger, the quality of the signal improves, but the power also increases. Also the calculations themselves require power dissipation.

An over-sampling digital to analog (D/A) converter like that of FIG. 4, which utilizes a second order delta sigma quantizer 70, and a low pass filter 71 to convert the data from the delta sigma quantizer 70 to analog signal yi, 61, is a very effective device. However, it has a relatively high output data transition rate, requiring higher power than is desirable. The use of a pulse width modulator to convert the high resolution, low rate data into a low resolution, high rate output signal reduces the transition rate, but introduces nonlinear distortion into the output signal, reducing its accuracy.

European patent EP 0576 701 B1 shows a hearing aid having an A/D converter to convert the input sound to a digital format, conventional digital signal processing, and a pulse width modulator to convert the high resolution, low rate data into a low resolution, high rate class D output, meaning the digital bit stream drives an output transducer directly. The output of the pulse width modulator has relatively low transition rates, but since there is no noise shaping in the circuit, it has a low signal to noise ratio. An extremely high clock rate would be required to achieve good audio fidelity.

Other systemic nonlinear effects may be introduced into the output signal by the output 1-bit or multilevel DAC or other parts of the output system. It is well understood that a delta sigma converter can be partially corrected for feedback non-linearity by introduction of a non linear element driving all of the feedback paths. There are many kinds of output distortions that cannot be corrected by this means. A need remains in the art for a D/A converter capable of compensating for nonlinear output distortion caused by predictable systemic factors that the single element cannot correct.

SUMMARY OF THE INVENTION

An object of the present invention is to compensate for systemic nonlinear distortion introduced into the output signal of a delta sigma digital to analog converter (DAC). Such a DAC is envisioned as especially useful for audio systems that utilize a class D output stage and a PWM driver, for high precision DAC systems by removing some of the difficult analog precision issues, and for digitally correcting analog imperfections in general delta sigma converters.

An example is a DAC for a hearing aid, where power dissipation is severely limited. Such a device would consist of a microphone to receive ambient sound, an analog to digital converter to convert the sound to a high resolution, low rate digital signal, digital processing circuitry to modify the quality of the high resolution, low rate digital signal, interpolator circuitry for converting the high resolution, medium rate digital signal to a medium rate, high resolution signal, and a digital to analog converter for converting the modified high resolution, medium rate digital signal back into analog sound.

The DAC converts a medium rate, high resolution digital signal into an analog signal, and includes a delta sigma modulator for converting the medium rate, high resolution digital signal into a medium rate, medium resolution digital signal, and may include a duty cycle demodulator connected to the delta sigma modulator for converting the medium rate, medium resolution digital signal into a high rate, low resolution digital signal, and a D/A device connected to the duty cycle demodulator for converting the high rate, low resolution digital signal into the analog signal. The duty cycle demodulator formats the high rate, low resolution digital signal into a predetermined low transition rate format.

As a feature, the delta sigma modulator is at least a second order delta sigma modulator having at least two feedback loops carrying a feedback signal, and also selects and applies a correction factor (stored in ROM for example) to at least one of the feedback loops based upon the predetermined low transition rate format and the feedback signal.

The duty cycle demodulator can include alternating means for alternating the predetermined low transition rate format between at least two different formats.

The delta sigma modulator may also be a higher than second order delta sigma modulator having more than two feedback loops carrying a feedback signal, and select and apply correction factors to more than one of the feedback loops based upon the predetermined low transition rate format and the feedback signal.

The duty cycle demodulator formats the high rate, low resolution digital signal into a predetermined low transition rate format by determining a multiple bit value corresponding to each input value of the medium rate, medium resolution digital signal and outputting the determined values as the high rate, low resolution digital signal. For example, the duty cycle demodulator might store a value corresponding each possible input value of the medium rate, medium resolution digital signal (in ROM for example), and look up the corresponding stored value for each medium rate, medium resolution digital signal input. The duty cycle demodulator may utilize a parallel to serial converter connected to the ROM, for converting the parallel looked up values into the high rate, low resolution, low transition digital signal.

The DAC might have a class D output stage for driving an output speaker. Especially in the case of a hearing aid, it might be implemented in an integrated circuit and operate at 1.1 volts or lower.

A single multiphase adder may comprise all of the accumulator arithmetic elements and the feedback arithmetic elements within the delta sigma modulator. For example, the single multiphase adder may comprise a three input adder operating in three phases. In this case, the first phase adds the input to the delta sigma modulator plus the previous output of the first stage plus the negative of the feedback, the second phase adds the current output of the first stage plus the previous output of the second stage, and the third phase adds the current output of the first stage plus the current output of the second stage, and feeds the quantizer.

The present invention is also useful in many other environments, to account and correct for other types of nonlinear feedback distortion. The delta sigma modulator in each case is at least second order, having feedback loops to each accumulator. Each feedback loop has a different correction factor applied to it to compensate for repeatable nonlinear distortions in the output stages. These correction factors differ from one another in nontrivial ways in order to account for nonlinear distortion.

A second example of an environment in which a delta sigma modulator including feedback correction according to the present invention is useful is where the delta sigma modulator including the correction circuitry is connected to a 1-bit or multilevel output DAC. The DAC might generate output pulses having slew rate problems, variations in the duration or height of pulses, or other nonlinear systemic output signal errors.

A delta sigma modulator including feedback correction according to the present invention is also useful in correcting errors generated in a high quality multilevel digital to analog converter utilizing a pattern generator and multiple output DACs. Each DAC tends to generate pulses having nonlinear systemic variations.

A delta sigma modulator including feedback correction according to the present invention is also useful in correcting errors generated in an audio power amplifier driving a speaker in class D mode. The signals generated by the class D output drivers have slew rate problems leading to nonlinear errors in the driving signal.

BRIEF DESCRIPTION OF THE DRAWINGS

FIG. 2 shows output yi for a sinusoidal input xi, for the

FIG. 7 is composed of FIGS. 7A through 7E, and shows several useful data formats for output from the duty cycle demodulator of FIG. 6.

FIG. 17 provides a C program simulation of the demodulator of FIG. 5, which utilizes the compensated delta sigma quantizer of FIG. 10.

DETAILED DESCRIPTION OF THE PREFERRED EMBODIMENT

Figure 4:
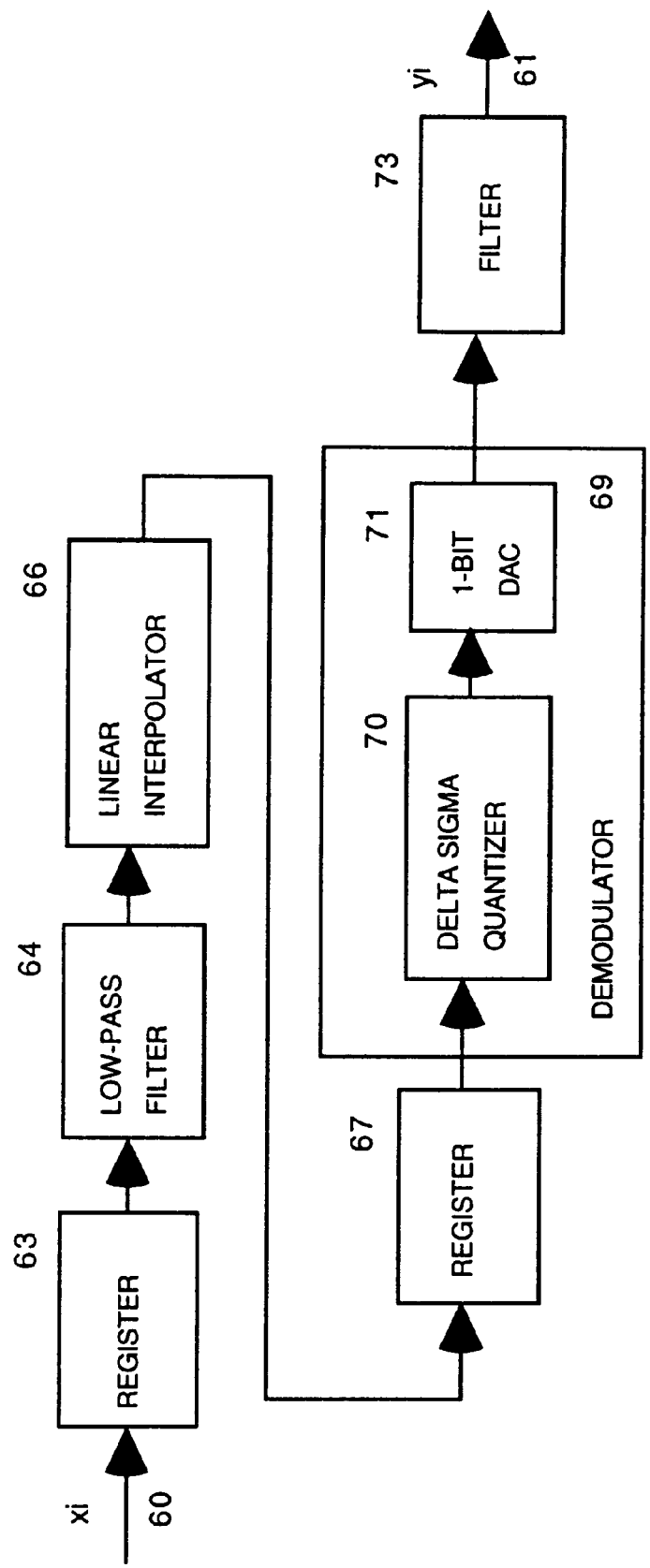
FIG. 4 (prior art) shows an over-sampling D/A converter system, which utilizes a second order delta sigma quantizer like that of FIG. 3 and a 1-bit D/A converter as the demodulator.
Figure 5:
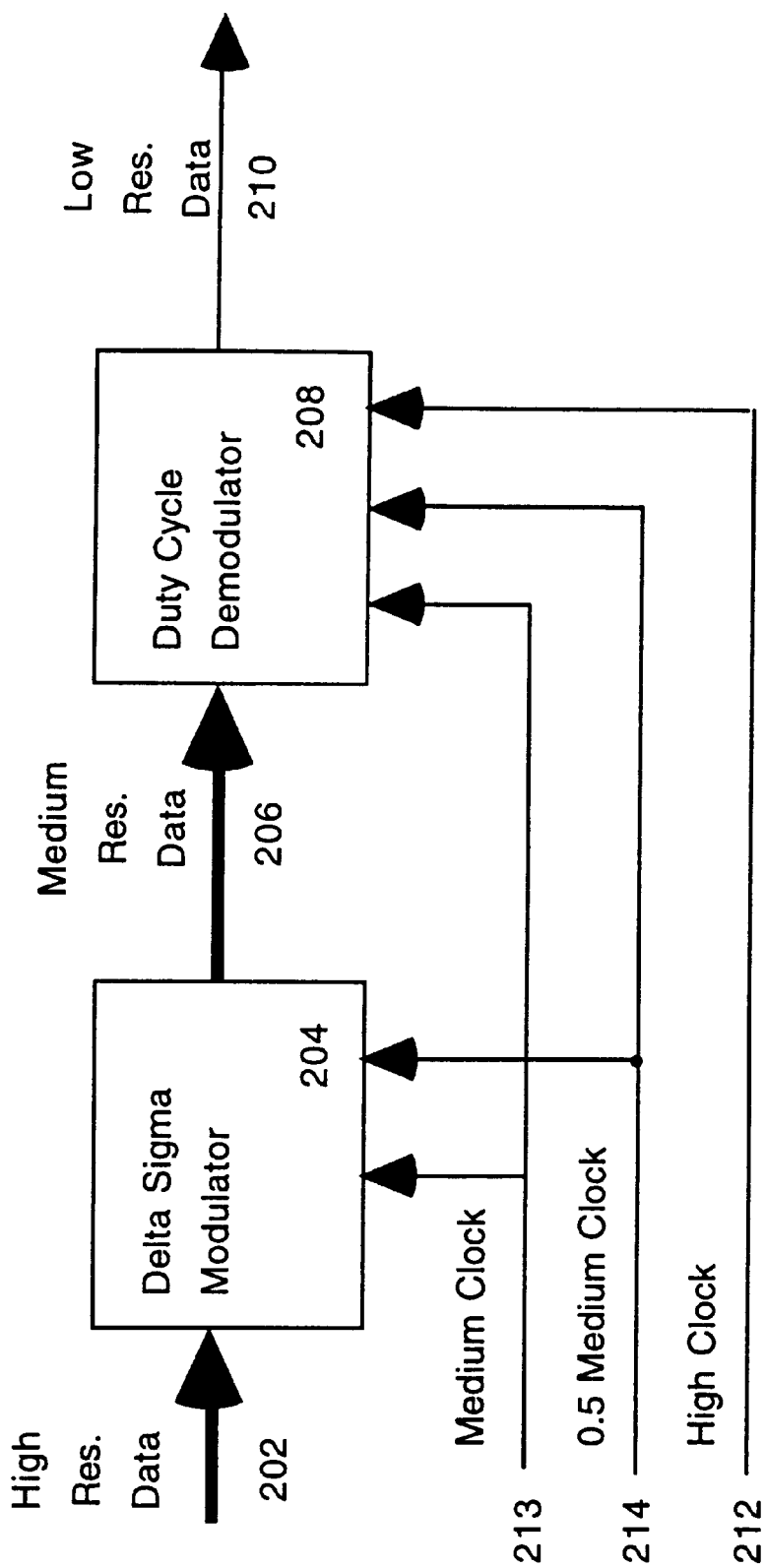
FIG. 5 shows a demodulator according to the present invention, including a delta sigma data converter and a duty cycle demodulator.

FIG. 5 shows a demodulator which might be used in an over-sampling D/A converter such as the one shown in FIG. 4, replacing demodulator 69 in that Figure. High resolution data 202, for example 12 to 20 bit data, enters delta sigma converter 204. The sample rate of this data has already been increased from the low rate clock required to code the data, to a medium rate clock used to clock the delta sigma converter. The ratio of the low to the medium clock will typically be a factor of 32 to 1024, for example a low clock of 16 kHz to a medium clock of 1 MHz. Delta sigma modulator 204 is clocked by medium clock 213, for example at 1 MHz, to generate medium resolution data 206 (2 to 5 bit for example). Duty cycle demodulator 208 is clocked by medium clock 213 and high clock 212. The frequency of the high clock is a multiple of the medium clock, for example 16 MHz. Duty cycle demodulator 208 is shown in more detail in FIG. 6. The output of duty cycle demodulator 208 is low resolution data 210, typically in one or two bit format, at the high clock rate.

The optional 0.5 medium clock 214 is used for alternating output data formats, such as the alternating output data format shown in FIG. 7E below. Since two different output formats are used in alternating fashion, the 0.5 medium clock rate selects one of the formats for every other data frame output from ROM 220 (shown in FIG. 6). For example, for each even frame, 0.5 medium clock 214 would be low, telling ROM 220 to use the grow from right format. For odd frames, 0.5 medium clock 214 would be high, and the grow from left format would be used. 0.5 medium clock 214 is not used for the data formats shown in FIGS. 7A–D, because these formats do not alternate. ROM 220 must be twice as big for the alternating case, in order to hold both formats (grow from right and grow from left in the 7E case). Delta sigma modulator 204 also uses 0.5 medium clock 214 for the alternating case, because a different correction factor will be used depending upon which output format is being applied by ROM 220.

Figure 6:
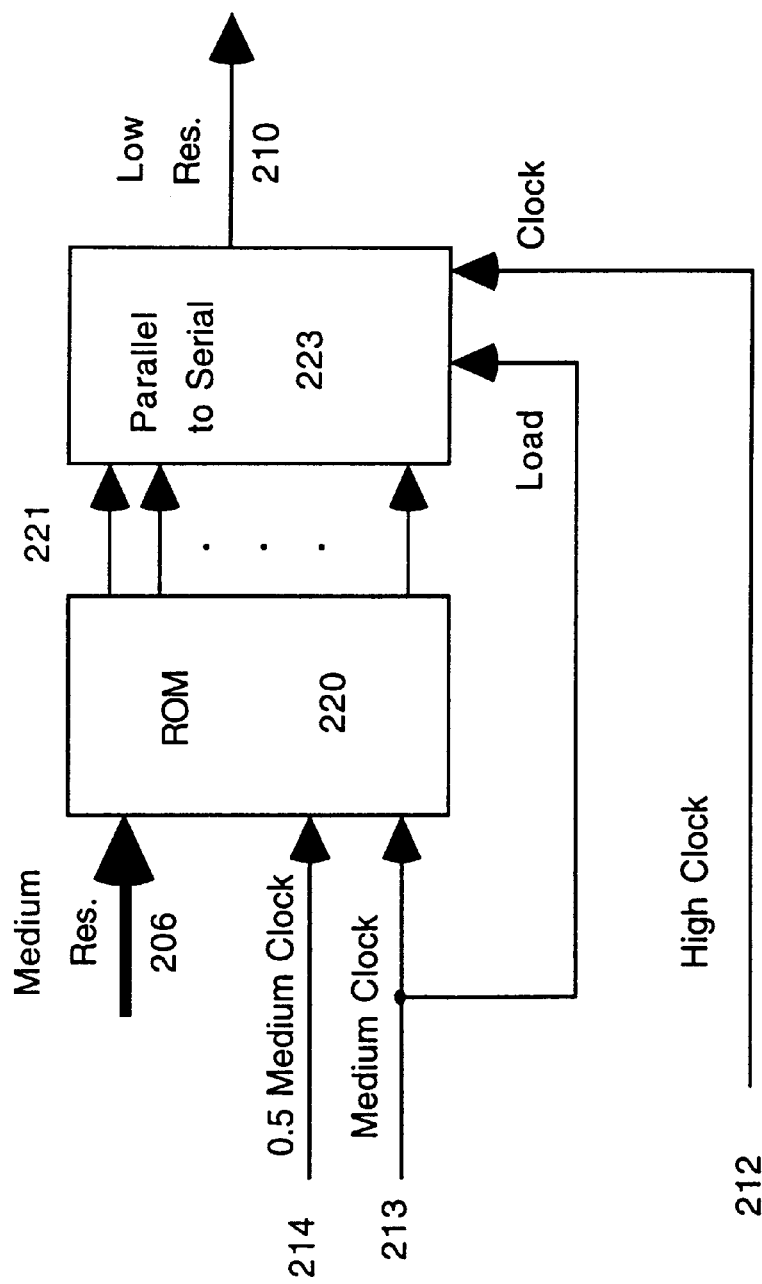
FIG. 6 shows a more detailed diagram of the duty cycle demodulator of FIG. 5.

FIG. 6 shows duty cycle demodulator 208 in more detail. Duty cycle demodulator 208 comprises combinatorial logic only, and does not involve any feedback loops. Thus it is deterministic, and has little or no memory (carries minimal state). In the preferred embodiment, duty cycle demodulator 208 comprises a ROM 220 containing a lookup table, and a parallel to serial data converter 223. Medium resolution input data 206 is used to look up data in ROM 220, which is output in parallel over lines 221. The data stored in ROM 220 is chosen to minimize the number of transitions in its output, thus minimizing the amount of power needed to drive the demodulator. Depending upon what is stored in ROM 220, the data on lines 221 may be in variety of useful, low transition rate formats, such as those shown in FIGS. 7A–7E. The ratio between high clock 212 and medium clock 213 is determined by the number of parallel lines 221. For example, if there are 16 parallel lines 221, high clock 212 might run at 16 MHz and medium clock 213 might run at 1 MHz. Parallel to serial data converter 223 would receive 16 bits of data in parallel at 1 MHz and output serial data at 16 MHz. High clock 212 is only required to run parallel to serial converter 223.

Those skilled in the art will appreciate that many well known structures could be used to implement duty cycle demodulator 208. For example, the look up function could be done with gates instead of ROM 220. Or the data could be clocked out in two chunks of eight bits each, for example. The parallel to serial conversion could be done in several stages. Its output could be two parallel bits rather than one. The duty cycle demodulator could also be realized by logic decodes applied to the output of the frequency divider which produces the medium clock from the high clock. State machine implementations could also be used.

A pulse width demodulator is one example of a possible duty cycle demodulator 208. In this case, the contents of ROM 220 would implement the grow from left pattern shown in FIG. 7D.

Figure 7A:
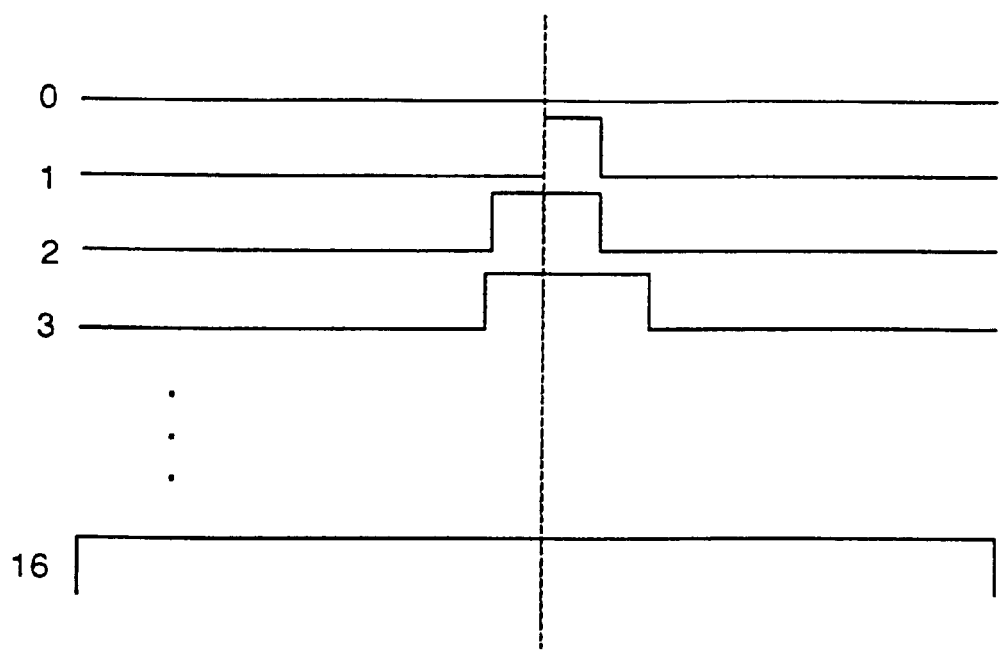
FIG. 7A shows the centered, growing to the right format.
Figure 7B:
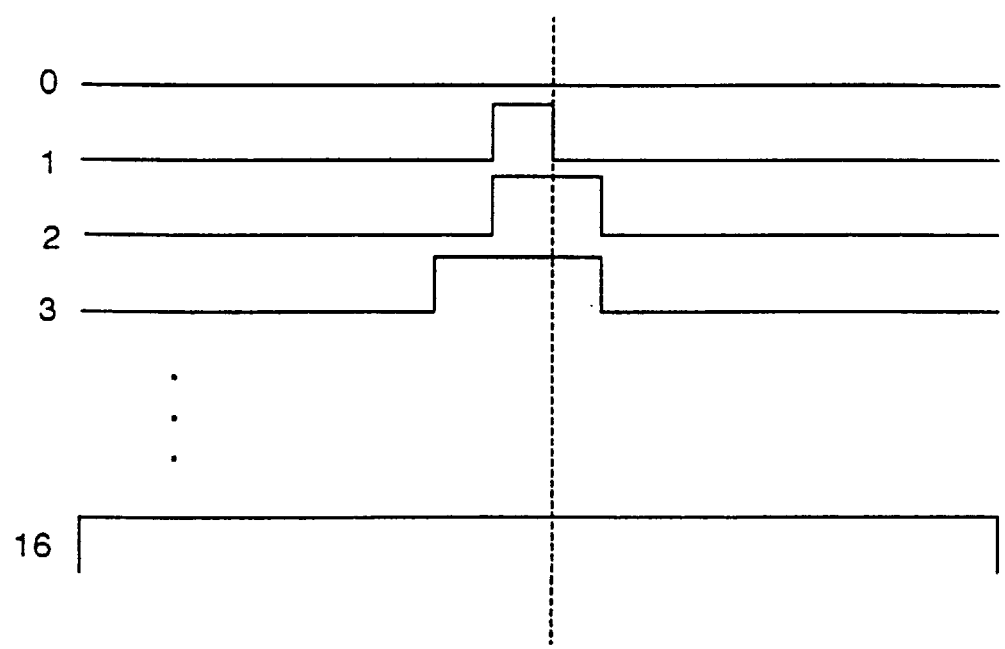
FIG. 7B shows the centered, growing to the left format.

FIG. 7 is composed of FIGS. 7A through 7E, and shows several possible data formats output from duty cycle demodulator 200 of FIG. 6. FIG. 7A shows the centered, growing to the right format. This, a one is to the right of the center line and a three has two bits to the right and one bit to the left. The even number values are centered. FIG. 7B shows the centered, growing to the left format. Thus, a one is to the left of the center line and a three has two bits to the left and one bit to the right.

Figure 7C:
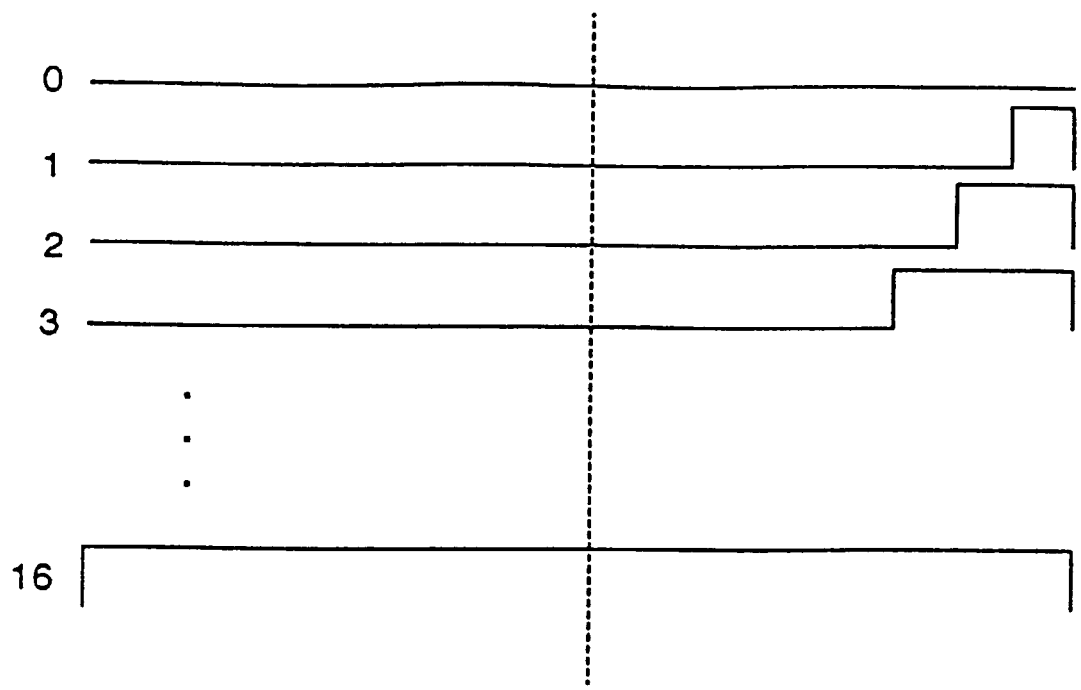
FIG. 7C shows the growing from the right format.
Figure 7D:
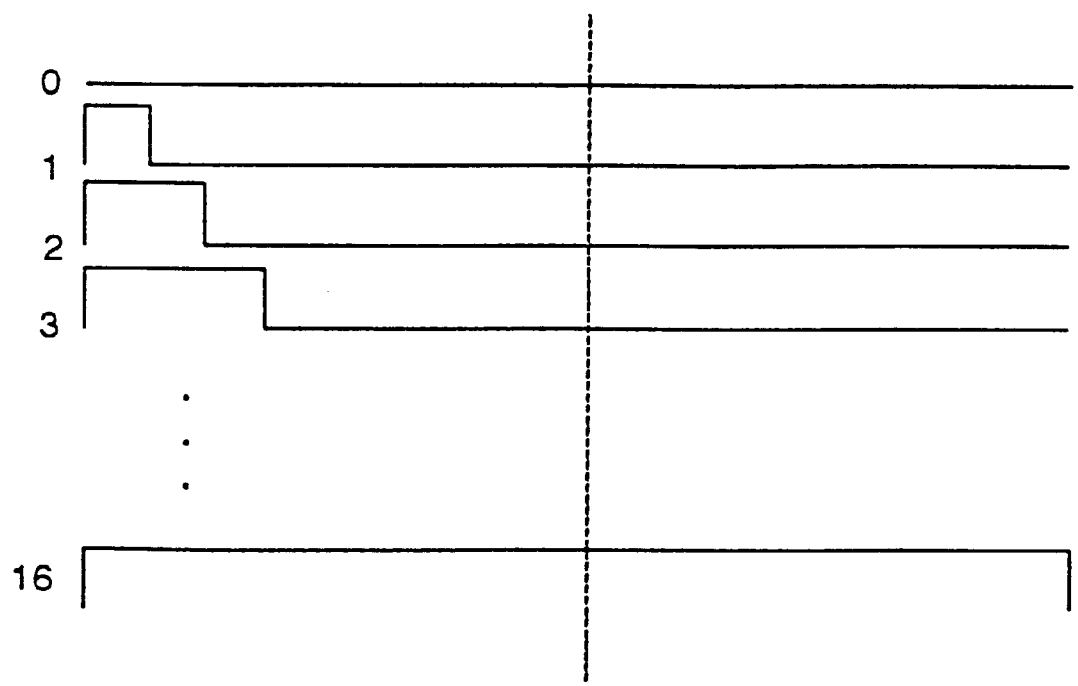
FIG. 7D shows the growing from the left format.

FIG. 7C shows the growing from the right format. FIG. 7D shows the growing from the left format. The growing from the left and growing from the right formats result in larger discontinuity noise than the other formats, and so are somewhat less useful.

Figure 7E:
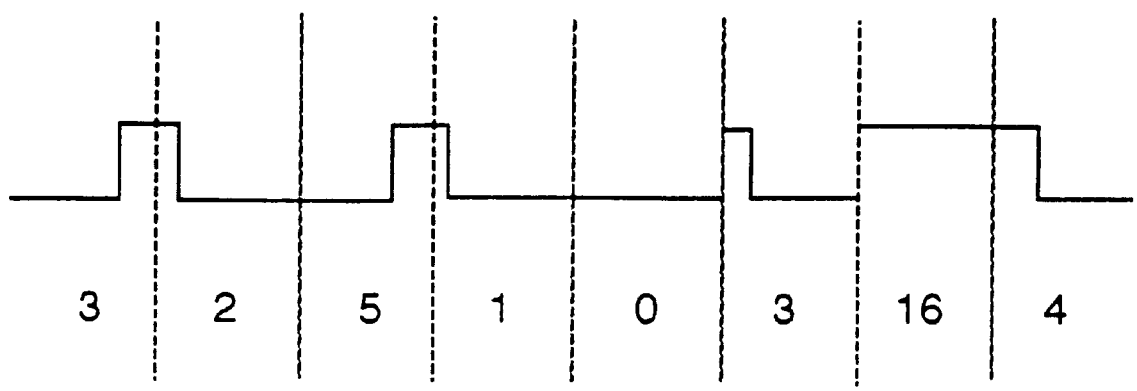
FIG. 7E shows alternating format, wherein odd cycles grow from the right, and even cycles grow from left.

FIG. 7E shows the alternating format wherein odd cycles grow from the right, and even cycles grow from the left. This format is particularly useful, because it requires half as many output data transitions as any of the above formats. However, the design is more complex, as described above. To illustrate this format, the following values are shown in sequence: 3, 2, 5, 1, 0, 3, 16, 4. Obviously it would be equivalent to have odd cycles grow from the left, and even cycles grow from the right.

In all of the formats shown in FIGS. 7A–7E, the area under the output curve (first integral) is directly proportional to the input value. In other words, the first order effect is equivalent to an ideal impulse function. This is not true, however, for the second integral, which will induce some level of distortion. A simple description is that the center of gravity of the signal does not remain at the same time position in the signal. Compensation is required to achieve low distortion and good signal to noise ratio.

Figure 3:
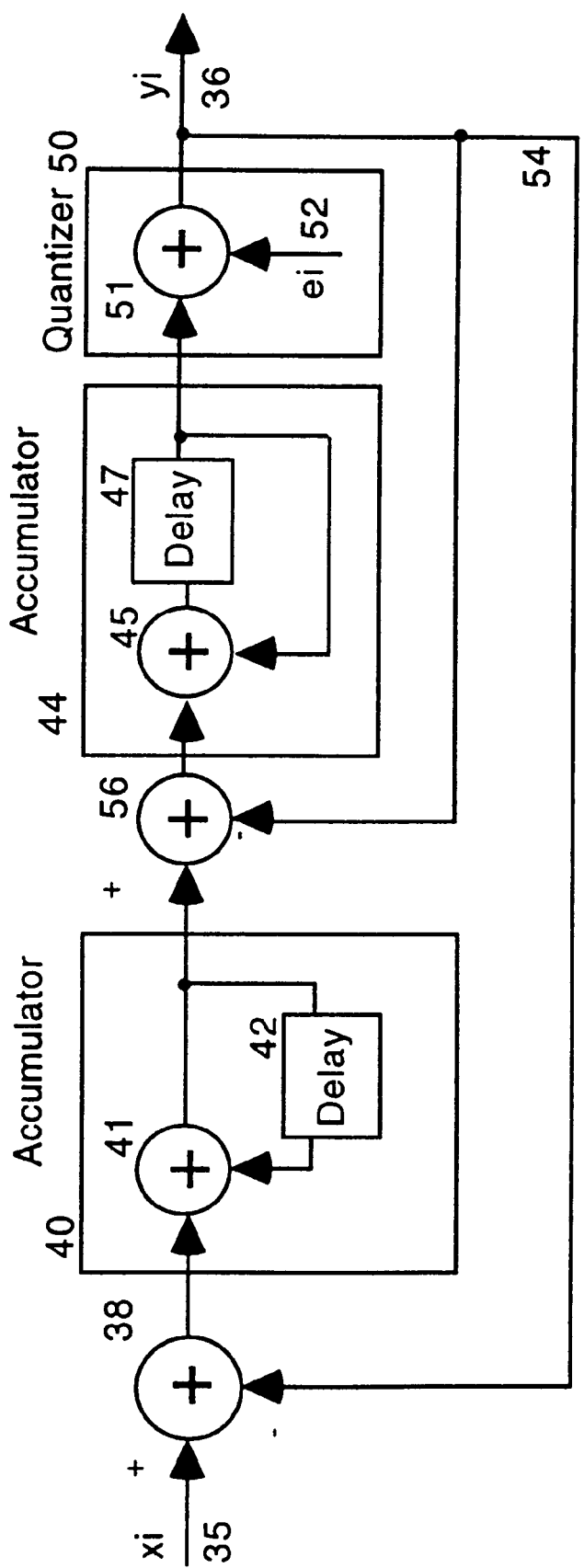
FIG. 3 (prior art) shows a common second order delta sigma quantizer.
Figure 8:
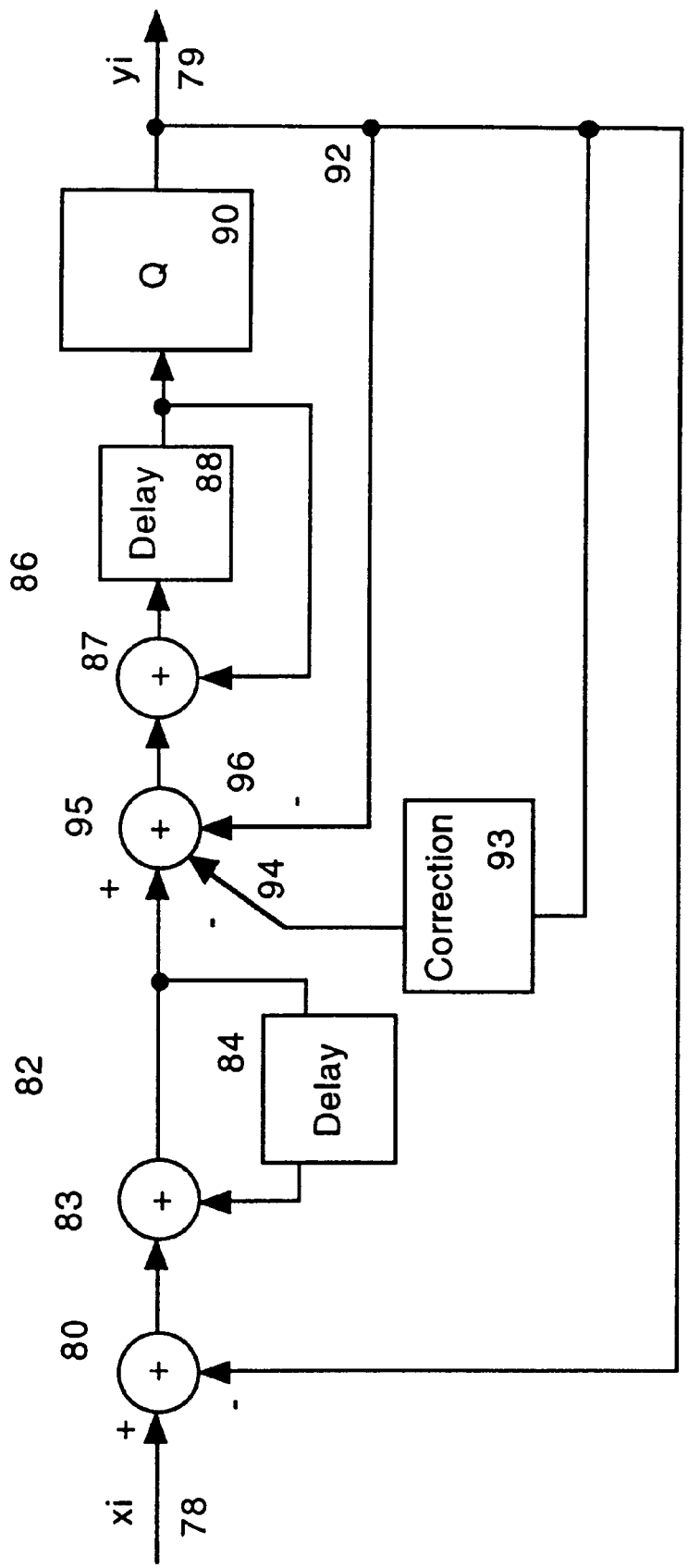
FIG. 8 shows a second order delta sigma quantizer, having feedback compensated for low transition demodulator output data, according to a first embodiment of the present invention.

FIG. 8 shows a first embodiment of a second order delta sigma quantizer which could be used as delta sigma converter 204 of the demodulator of FIG. 5. The delta sigma converter of FIG. 8 has feedback 92 compensated for the format applied to the data by duty cycle demodulator 208. The structure of the embodiment of FIG. 8 is identical to the structure of the second order delta sigma quantizer of FIG. 3, except that the feedback into adder 95 has been corrected by correction block 93, and quantizer 90 is a multiple bit quantizer.

Input xi, 78, is added to feedback signal 92 by adder 80. The signal from adder 80 is fed into first accumulator 82, comprising delays 84 and adder 83. The output of accumulator 82 is added to corrected feedback signal 94 and fed into second accumulator 86, comprising delay 88 and adder 87. The output of accumulator 86 goes into multi-bit quantizer 90. Quantized output 79 (yi) also feeds back as feedback signal 92. Quantizer 90 has more than two signal levels for its output.

Correction block 93 is shown as a black box which has feedback signal 92 as an input and correction signal 94 as an output. In the preferred embodiment, correction block 93 uses signal 92 to lookup a correction factor in ROM and supplies it to adder 95 to be added to feedback signal 96. Equivalently, correction block could have as its output a signal comprising feedback signal 92 added to the correction factor. Then, feedback signal 96 would be removed.

Figure 13:
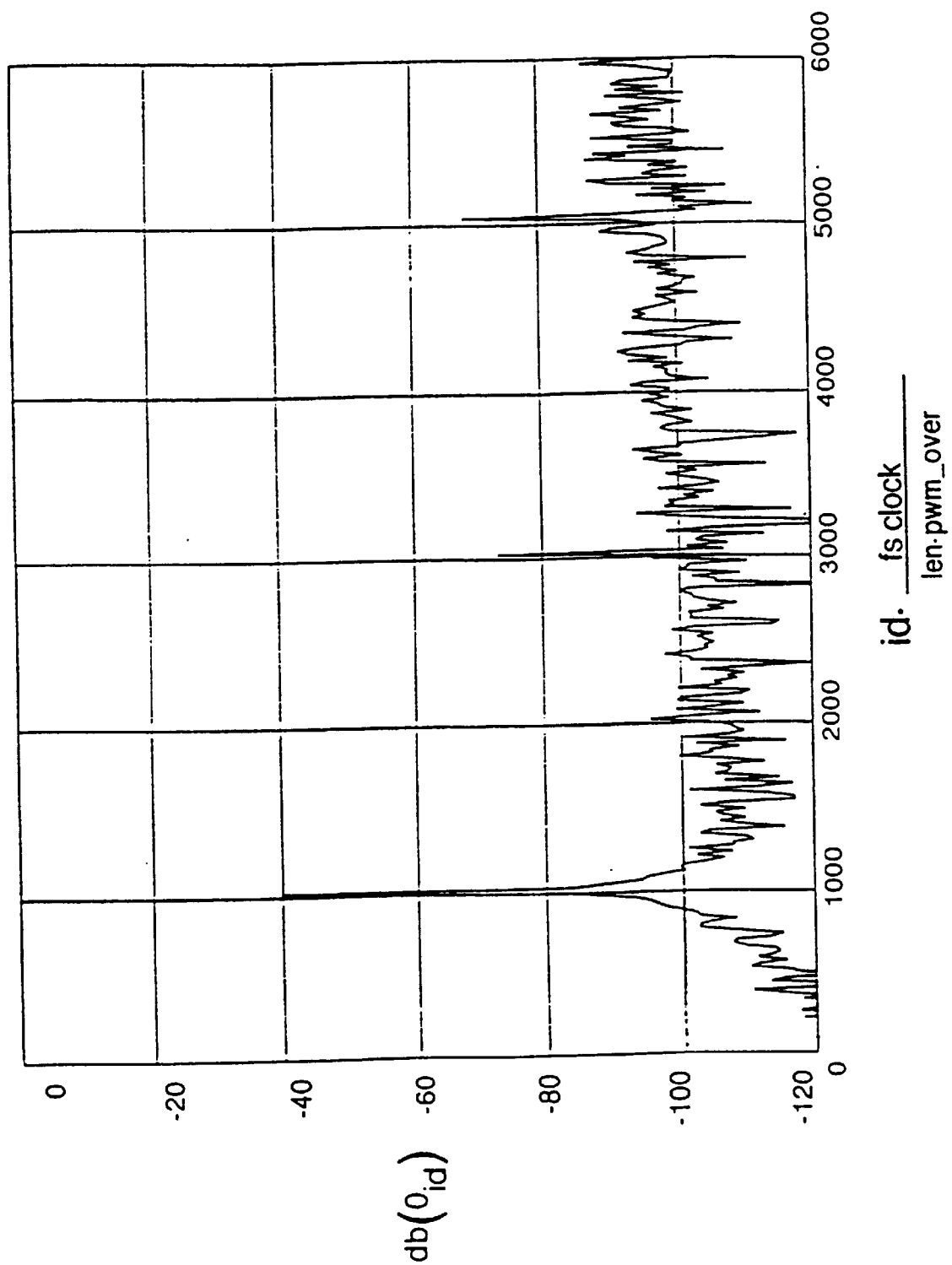
FIG. 13 shows the output signal of the demodulator of FIG. 5, which utilizes a delta sigma quantizer without the compensation of the present invention, for an input signal comprising a sine wave at −40 dB.

The contents of the ROM of correction block 93 are chosen to correct for the format of the data output from duty cycle demodulator 208. The required output of the correction block can be simply calculated by taking the second integral of the output data patterns, and subtracting the ideal, linear value. FIG. 13 shows a C program simulation of a demodulator utilizing the centered, grow to the right, format of FIG. 7A. The ROM utilized in that program (using that choice of parameters, data formats, clock ratios, etc.) would be designed as follows:

1) Choose a 0 time position. In this case, we will use the center of the time frame as 0.
2) Calculate the times of the center of each single unit pulse. In the present example they are (left to right):

$-15/32$
$-13/32$
$-11/32$
$-9/32$
$-7/32$
$-5/32$
$-3/32$
$-1/32$
$1/32$
$3/32$
$5/32$
$7/32$
$9/32$
$11/32$
$13/32$
$15/32$

3) Sum the elements from the above calculation that are used within any given pulse. As an example, for the 1 wide case, $1/32$ is used, and the sum is $1/32$. For the 2 wide case, $-1/32$, $1/32$ are used, and the sum is 0. For the three wide case, $-1/32$, $1/32$, $3/32$ are used, and the value is $3/32$. For the five wide case, $-3/32$, $-1/32$, $1/32$, $3/32$, $5/32$ are used, and the value is $5/32$. This value is multiplied by the feedback value for a single step, in the case of the C program of FIG. 17, 2048 (hex 0800), to get the correction table value 320 for the 5 entry (hex 0140).

As these pulses are growing to the right, the odd outputs are late relative to the center. Therefore the correction term will have signs opposite to the feedback term.

It is also possible to use a correction factor in each feedback loop of the delta sigma converter of FIG. 8 (i.e. compensate the path to adder 80 as well as to adder 95). This technique would be used if the output stage was nonlinear in energy, but in normal cases this compensation path would be a one-to-one function (i.e. uncompensated).

Figure 9:
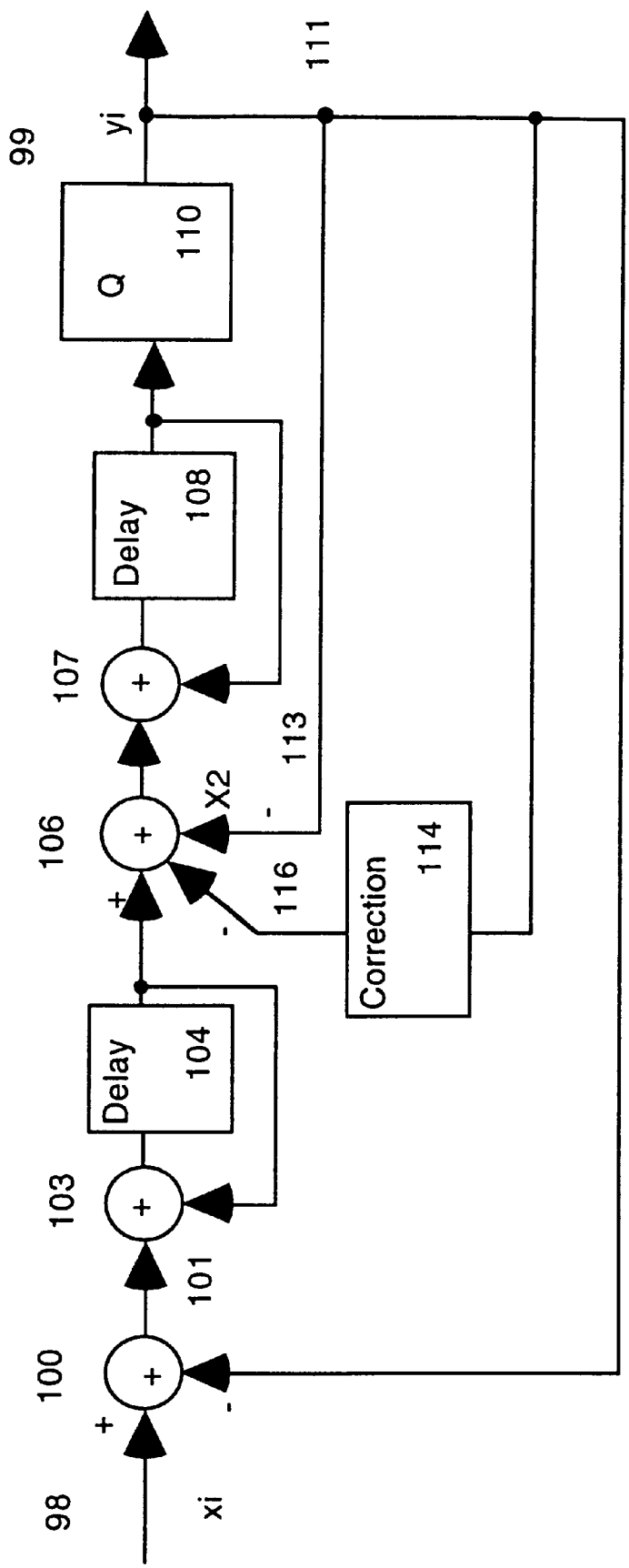
FIG. 9 shows another compensated second order delta sigma quantizer according to a second embodiment of the present invention.

FIG. 9 shows another compensated second order delta sigma quantizer according to a second embodiment of the present invention. It is shown and described in order to illustrate how the compensation function may be used in any delta sigma quantizer.

In the compensated delta sigma quantizer of FIG. 9, input signal xi, 98, is added to the negative of feedback signal 111 by adder 100, to form signal 101. Adder 103 adds 101 to the signal from delay 104 and feeds the result to adder 106. Adder 106 adds this signal to the negative of signal 113, which is feedback 111 multiplied by 2, and to signal 116 which is the correction term formed by correction block 114. The output of adder 106 is added to the signal from delay 108 by adder 107. The result is quantized by quantizer 110 to form output 99 and feedback signal 111. Feedback 111 is compensated for variable center of gravity by correction block 114, as described above.

Figure 10:
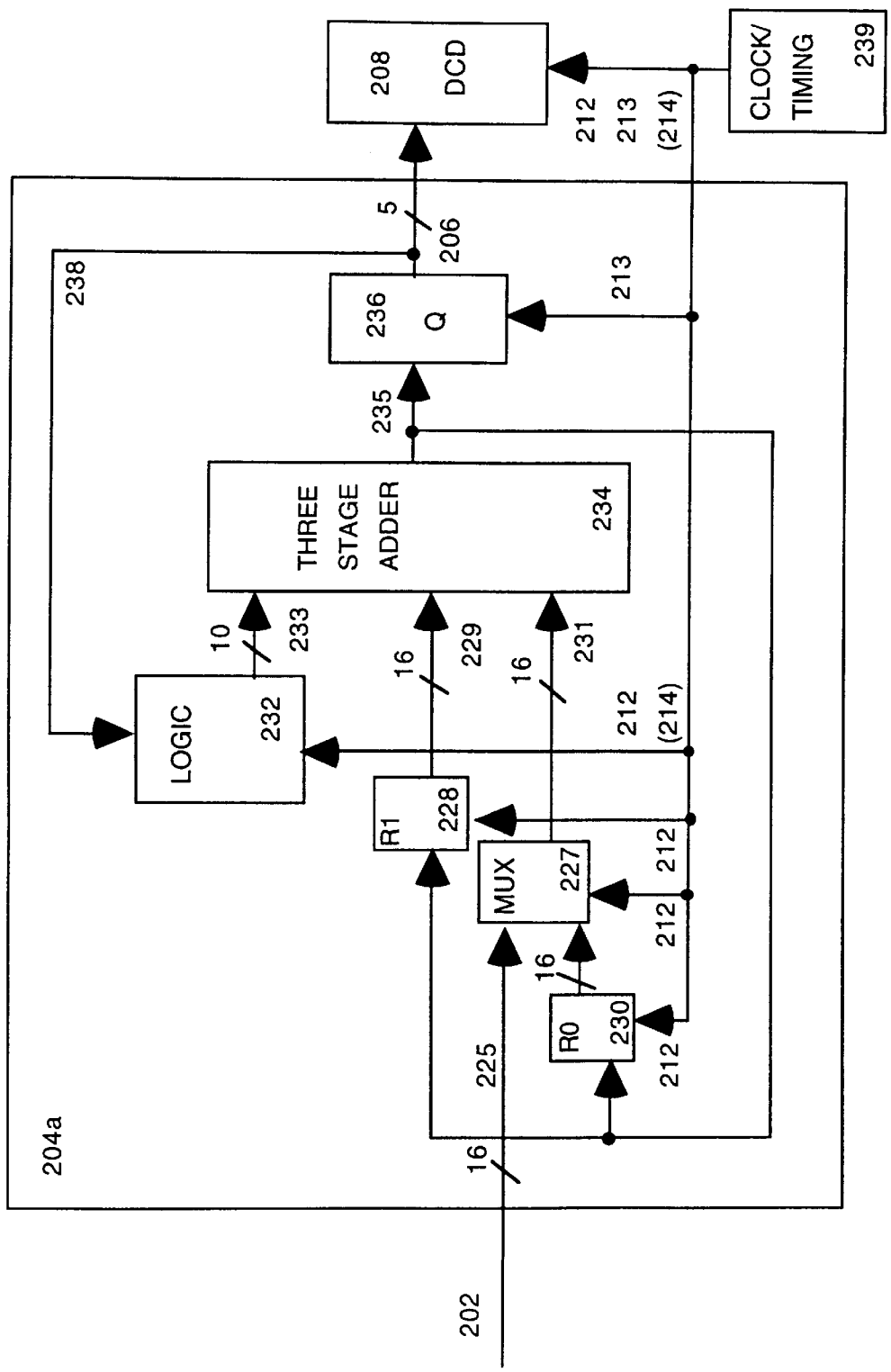
FIG. 10 shows a demodulator according to the present invention, utilizing a third compensated second order delta sigma quantizer.

FIG. 10 shows a demodulator in accordance with the present invention, utilizing a second order compensated delta sigma converter 204a. This particular implementation is especially appropriate for use with a duty cycle, as the mathematics are performed in multiple phases. Delta sigma converter 204a might be the delta signal converter shown in the signal flow graph of FIG. 11, which is an improvement on the second order delta sigma converters shown in FIGS. 8 and 9. The demodulator of FIG. 10 has been simulated by a C program shown in FIG. 17. FIGS. 13 through 16 show the performance of this circuit with the correction block turned on and off for two different signal levels.

The same numbering scheme is used in FIG. 10 as was used in FIG. 5, where the blocks are equivalent. Delta sigma modulator 204a of FIG. 10 is slightly different from delta sigma modulator 204 of FIG. 5, as described below. High resolution data 202 is input into delta sigma modulator 204a. For the example of FIG. 10, high resolution data 202 is sixteen bits. Delta sigma modulator 204a outputs medium resolution data 206, in this case five bits of data corresponding to 17 levels, to duty cycle demodulator 208. One difference between the demodulator of FIG. 5 and that of FIG. 10 is that high clock 212 is used by delta sigma modulator 204a of FIG. 10, to implement three stage adder 234, as described below.

Figure 11:
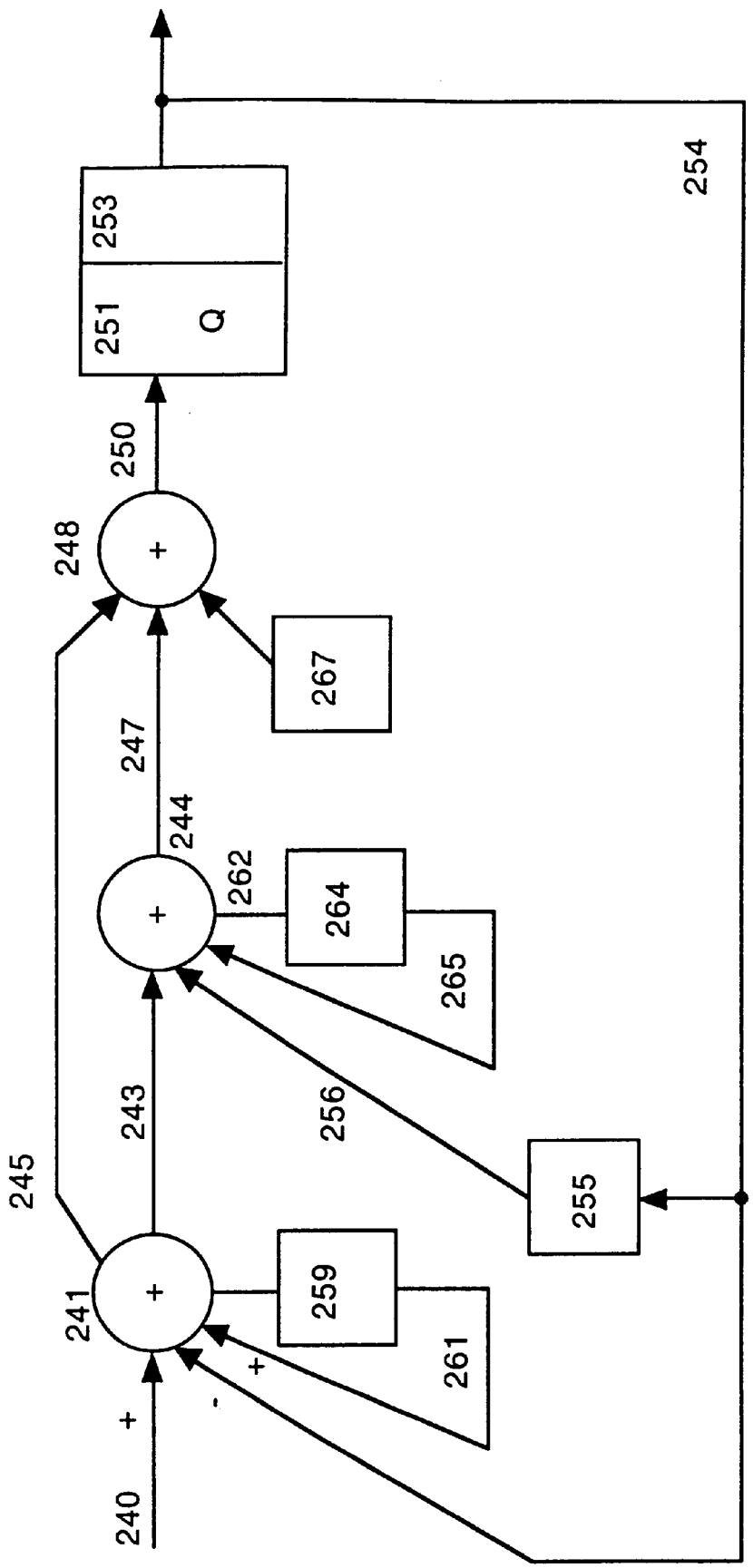
FIG. 11 shows a signal flow graph of a delta sigma quantizer which could be used in FIG. 10.

The circuit of FIG. 10 is very efficient, because it utilizes one three stage adder 234 to implement all three of the input adders (241, 244, and 250) of FIG. 11. This is possible because the adders always operate in sequence. The output of adder 241 in FIG. 11 feeds into adder 244, which feeds into adder 248. Each adding operation is performed by adder 234, while the inputs to adder 234 are determined by logic block 232 and multiplexor 227. The input to register 236 is disabled when adder 234 is acting as one of the first two adders (241, 244), and is enabled when adder 234 is acting as the third adder 248.

Thus, delta sigma modulator 204a of FIG. 10 steps through the three adder stages as follows. Adder stage 0 (241 in FIG. 11) has as its inputs: high resolution input data 202 selected by MUX 227 and passed to adder 234 (240 in FIG. 11), the delayed output of the first adder signal 235, passed through register 228 (signal 258 is put through delay 259 to form delayed signal 261 in FIG. 11), and feedback signal 238, which is selected and passed to adder 234 by logic 232 (feedback signal 254 in FIG. 11).

Adder stage 1 (244 in FIG. 11) has as its inputs: the output of the first adder stage, stored in register 228 and provided to adder 234 (signal 243 in FIG. 11), a correction factor (correction block 255 forms corrected feedback signal 256 in FIG. 11), and the delayed output of the second adder stage which is stored in register 230 and selected by MUX 227 (adder 244 output 247 is delayed by delay 264 to form delayed signal 265 in FIG. 11). For both adder stage 0 and adder stage 1, register 236 blocks signal 235.

Adder stage 2 (248 in FIG. 11) has as its inputs: a dither signal to prevent the system from generating tones, formed by logic 232 and passed to adder 234 (generated by block 267 in FIG. 11), the output of the first adder stage, still stored in register 228 and provided to adder 234 (signal 245 in FIG. 11), and the output of the second adder stage 229, forwarded by register 230 to MUX 227 (Signal 247 in FIG. 11). Since the results of this adder stage 2 will be output (after being passed through quantizer 251 and incorporated delay 253 in FIG. 11), register 236 accepts the sixteen bit output signal 235 from adder 238 and quantizes it, outputting it as medium resolution (5 bit) data 206, to duty cycle demodulator 208.

Clock and timing block 239 provides medium clock 213, 0.5 medium clock 214 (if used) and high clock 212. In FIG. 5, only medium clock 213 (and 0.5 medium clock 214, if used) are needed by delta sigma modulator 204, because each adder is implemented separately, and none need to operate at a higher rate than the medium clock. For delta sigma modulator 204a of FIG. 10, however, signals derived from high clock 212 are required by multiplexor (MUX) 227, register 228 and 230, and logic 232, in order to fit three stages of adding into the time line allowed for one frame of output date. Register 236 only requires medium clock 213. If 0.5 medium clock 214 is used (because the format applied by duty cycle demodulator 208 alternates, requiring correction logic within logic block 232 to alternate) 0.5 medium clock 214 is provided to logic block 232 and to duty cycle demodulator 208.

Obviously, high clock 212 runs at a higher rate than is required to have three adding stages. Up to sixteen adding stages could operate within delta sigma modulator 204a, if required, for example by a higher order delta sigma modulator. The additional adding stages may also be used to implement multiple input processing, such as stereo input. In this embodiment, input signal 202 would provide the right channel (for example) for three adding phases and then would provide the left channel for three phases. All registers would have two copies. Medium resolution signal 206 would alternate between left and right channel signals and circuitry would be provided to separate the right channel from the left channel and provide them to different speakers. Any extra time phases are not used.

Figure 12:
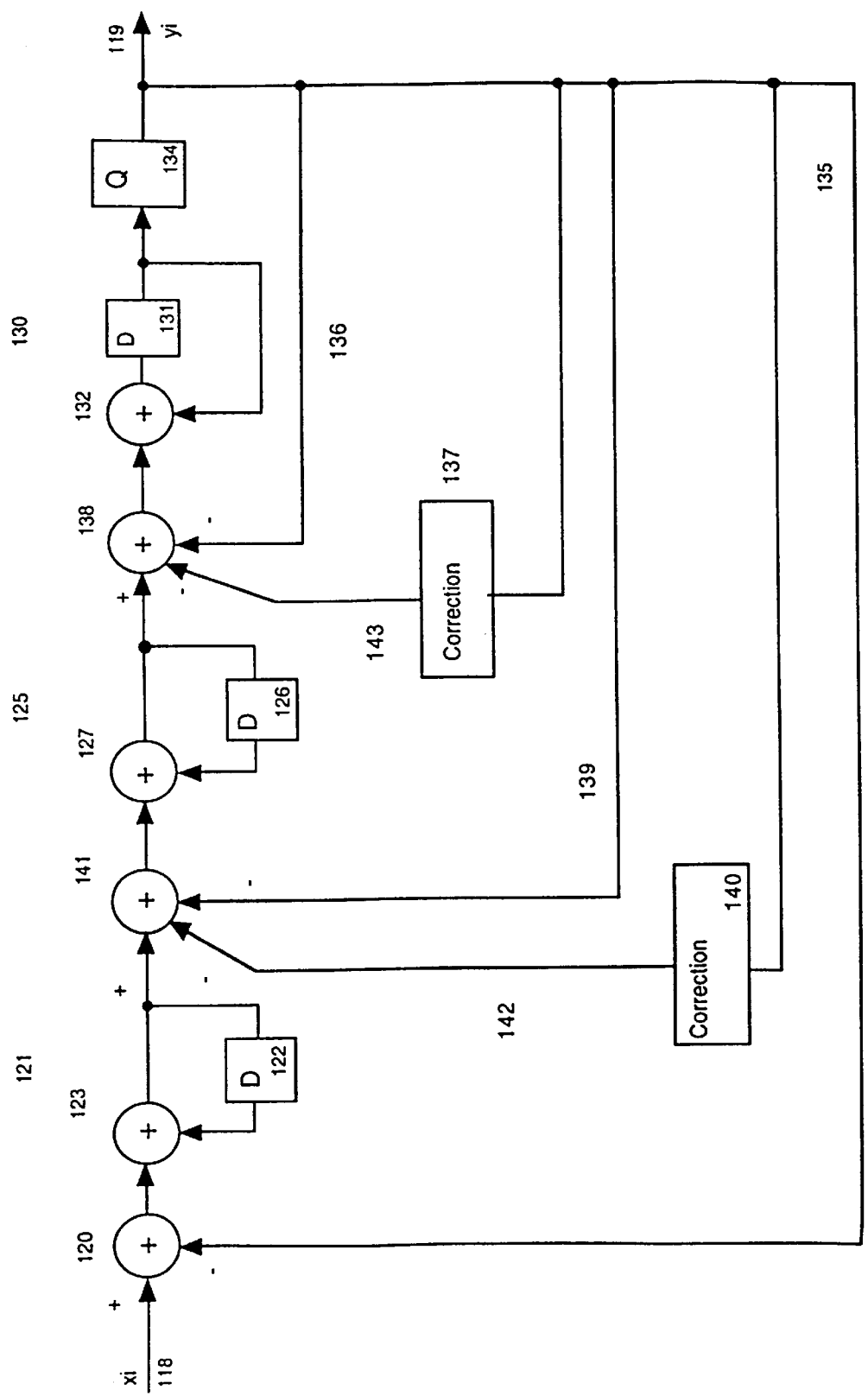
FIG. 12 shows a compensated third order delta sigma quantizer according to a fourth embodiment of the present invention.

FIG. 12 shows a compensated third order delta sigma converter in accordance with the present invention. The feedback signals into second accumulator 125 and third accumulator 130 must each be compensated for the output format of duty cycle demodulator 208 (shown in FIG. 5). These compensations will, in general, be different for each stage.

Input signal xi, 118, is combined with feedback signal 135 by adder 120 and fed into first accumulator 121. First accumulator 121 comprises delay 122 and adder 123. The output of accumulator 121 is added to feedback 139 and correction factor 142 from correction block 140 and fed into accumulator 125, comprising delay 1216 and adder 127. The output of accumulator 125 is added to feedback 136 and correction factor 143 from correction block 137 and fed into accumulator 130, comprising delay 131 and adder 132. The output of accumulator 130 is quantized by quantizer 134 to form output signal yi, 119, and feedback signal 135. Correction blocks (for example ROMs) 140 and 137 compute correction factors 142 and 14.3 as described above.

FIGS. 13 through 16 show the output signal of an oversampling D/A converter with and without the correction of the present invention, for two different signal levels. The D/A converter system is essentially identical to the D/A converter of FIG. 4, with the modulator shown in FIGS. 10 and 11 being used for demodulator 69. For FIGS. 13 and 15, the correction is turned off in FIG. 10. For FIGS. 14 and 16, the correction factor in FIG. 10 is applied. The D/A converter is simulated in FIG. 17 to generate each of these output signals.

Figure 14:
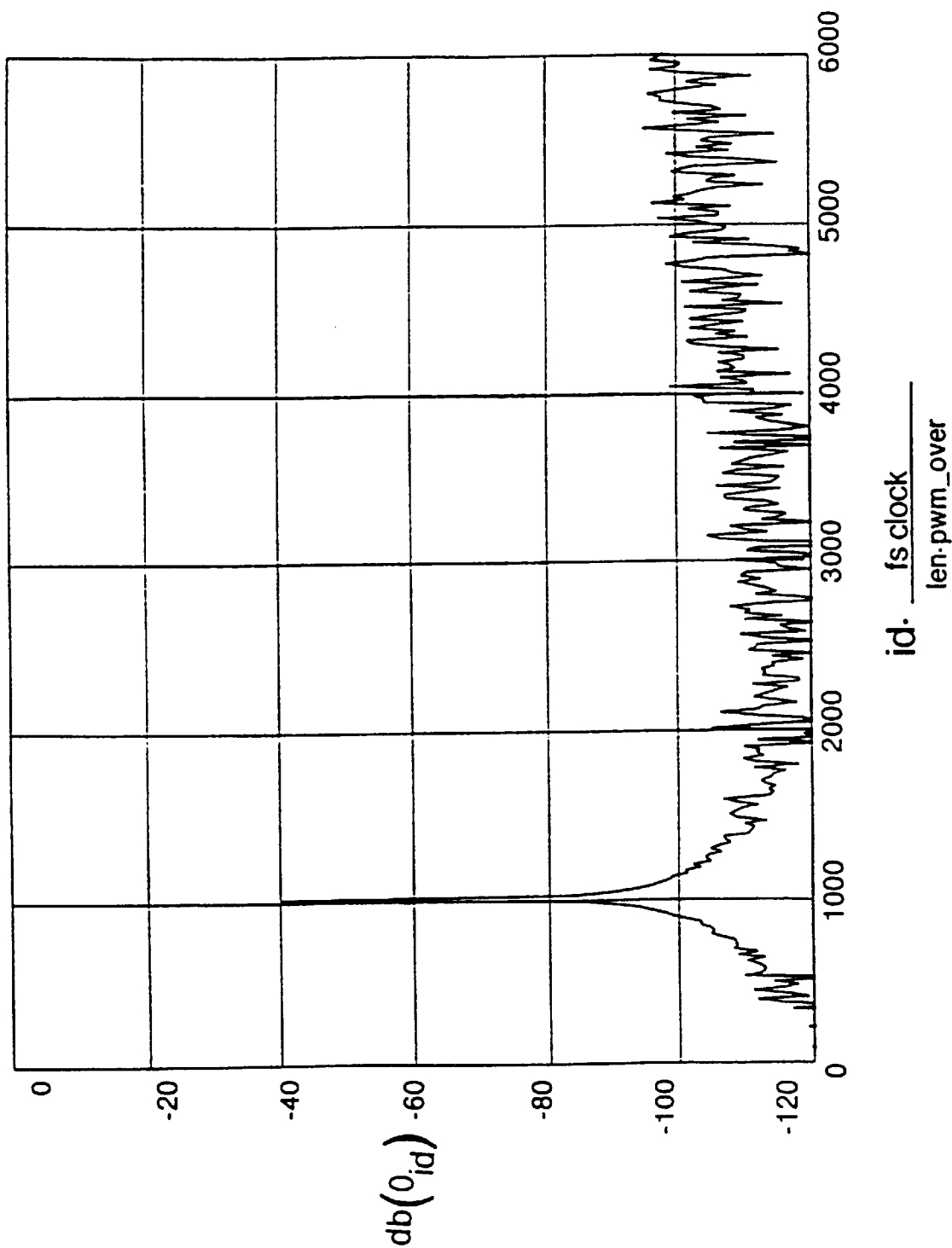
FIG. 14 shows the output signal of the demodulator of FIG. 5, which utilizes the compensated delta sigma quantizer of FIG. 10, for an input signal comprising a sine wave at −40 dB.

FIG. 13 shows the spectrum of the output signal 145, without the compensation of the present invention, for an input signal comprising a sine wave at −40 dB. This Figure was generated by the simulation of FIG. 17, with the correction turned off. FIG. 14 shows the spectrum of the output signal with the correction applied, for an input signal comprising a sine wave at −40 dB below full scale. Obviously, the signal to noise ratio has greatly improved.

Figure 15:
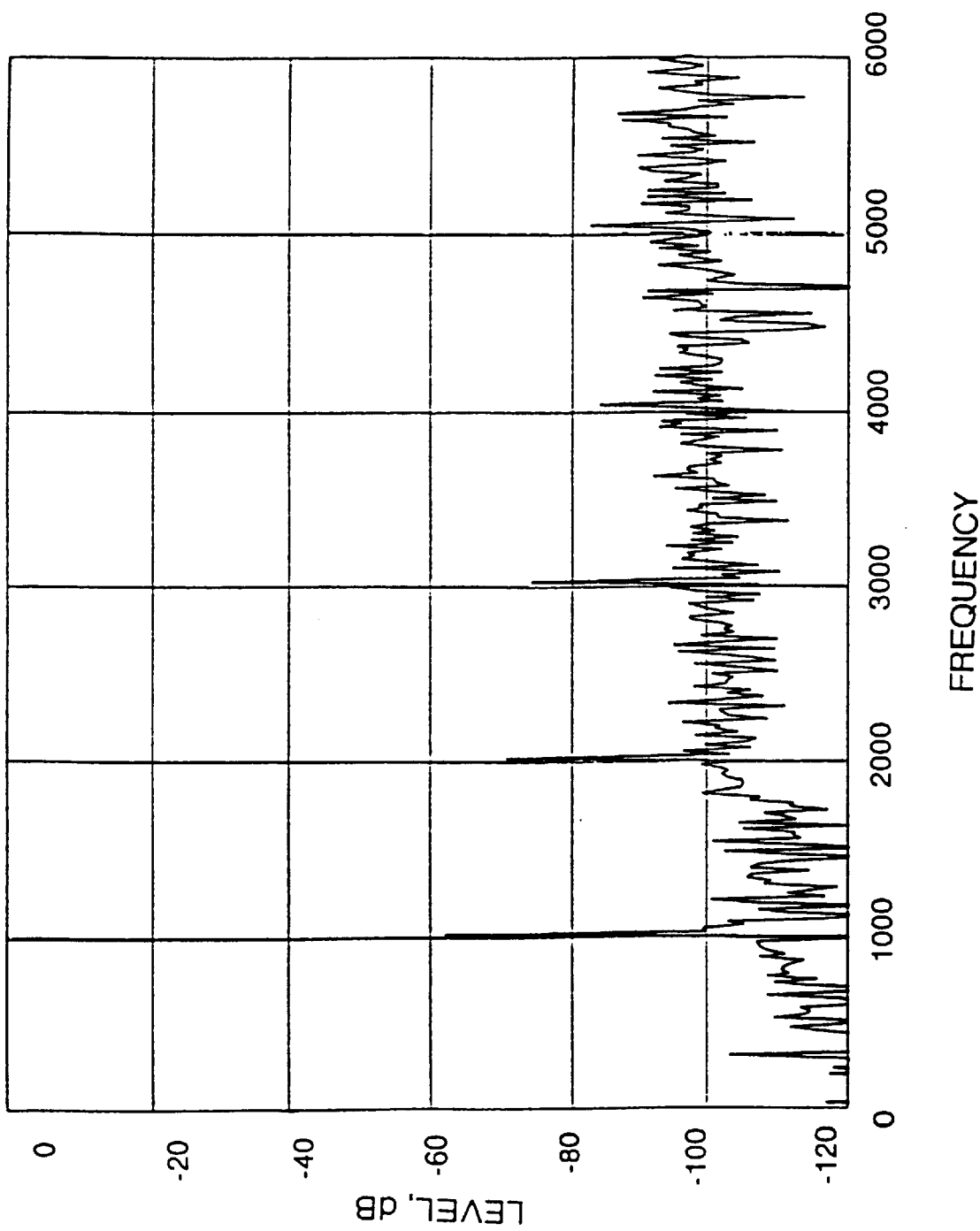
FIG. 15 shows the output signal of the demodulator of FIG. 5, which utilizes a delta sigma quantizer without the compensation of the present invention, for an input signal comprising a sine wave at −60 dB.
Figure 16:
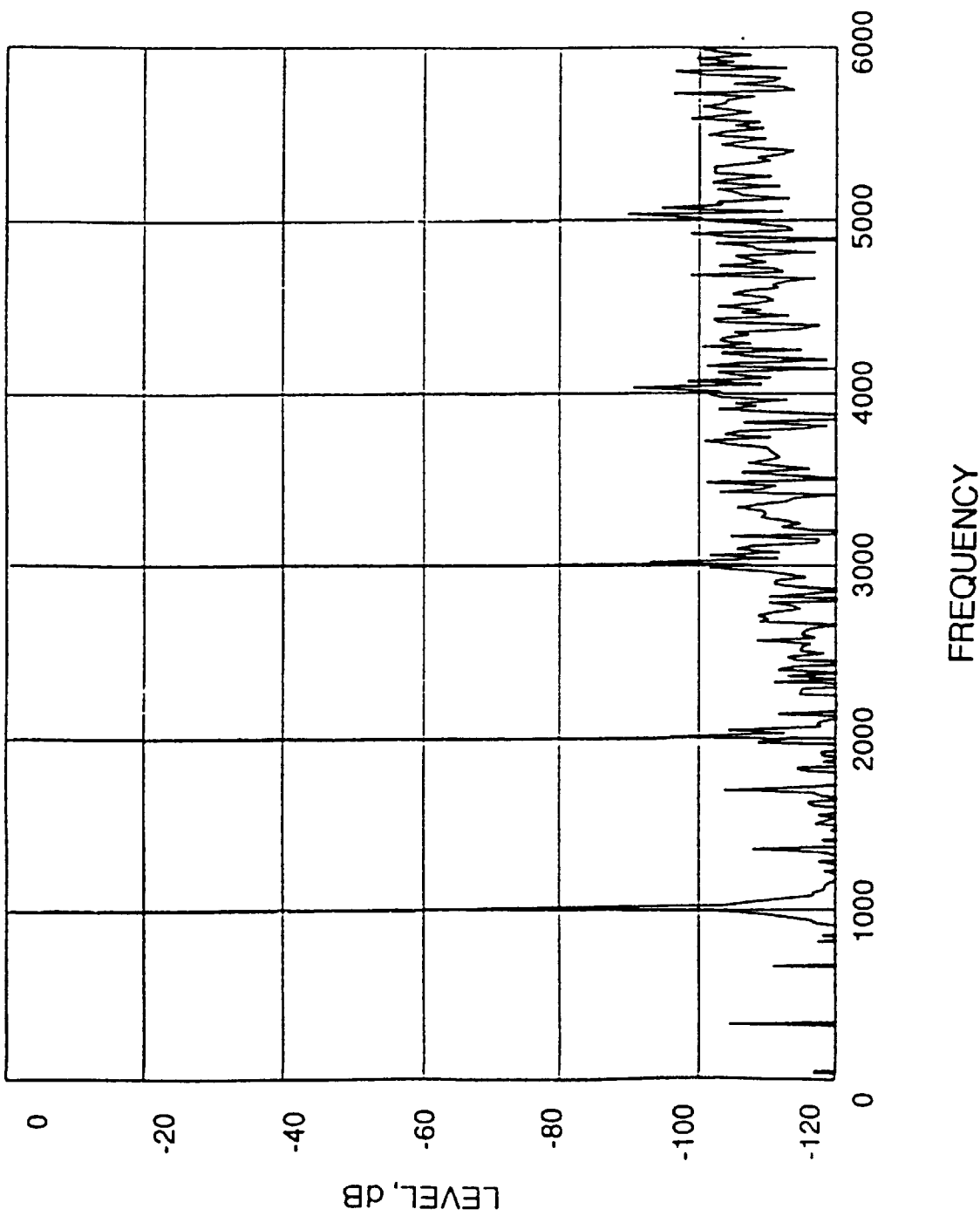
FIG. 16 shows the output signal of the demodulator of FIG. 5, which utilizes the compensated delta sigma quantizer of FIG. 10, for an input signal comprising a sine wave at −60 dB.

FIG. 15 shows the spectrum of the output signal 145 for an input signal comprising a sine wave at −60 dB. This Figure was generated by the simulation of FIG. 17, with the correction turned off. FIG. 16 shows the output spectrum with correction, for an input signal comprising a sine wave at −60 dB. With such a low input signal, the output signal is almost lost in the noise in the uncompensated case.

FIG. 17 provides a C program simulation of an oversampling D/A converter, which utilizes the compensated delta sigma quantizer of FIGS. 10 and 11. This particular embodiment applies a centered, growing to the right format, like that shown in FIG. 7A. The input signal is a 16 bit, 2 kHz sine wave. The output is a 1-bit format signal representing the sine wave which would be output by the system of FIG. 10.

In order, the sections of the C program show implementation of a linear feedback function (part of logic block 232), a correction factor applied to the second order feedback (part of logic block 232), and optimized for the centered, growing to the right format), ROM 220 for duty cycle demodulator 208 (centered, growing to the right format), a three input, sixteen bit adder 234 which saturates (overflows take the maximum value and underflows take the minimum value), quantizer 236 (which returns a value in the range 0 to 16), test signal generation (for signal 202), bias (or dither) generator (part of logic block 232), delta sigma modulator 204a, and duty cycle demodulator 208. Arrays fb and cor show feedback and correction signals appropriate for the duty cycle modulator described by the array out_rom. It is understood by those versed in the art that adding a dither signal can improve the quality of the noise generated by delta sigma converter system, and is shown added in this program.

The implementation of delta sigma modulator 204a (called "main") implements the first stage of adder 232 (241 in FIG. 11), whose output is called "r0". "r1" is the output of the second stage of adder 234 (adder 244 in FIG. 11) and "out" is the third stage of adder 232 (adder 248 in FIG. 11) after quantization by quantizer 236 (251 in FIG. 11).

Figure 18:
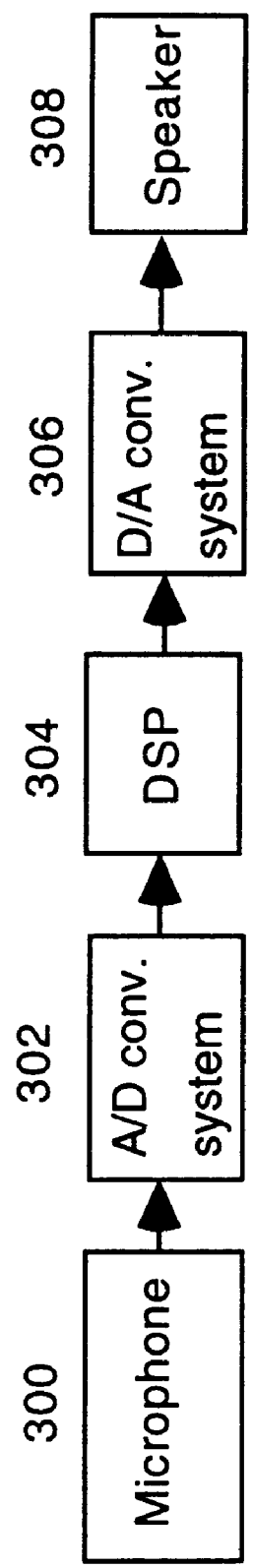
FIG. 18 shows a hearing aid utilizing the demodulator of FIG. 5.

FIG. 18 shows a hearing aid comprising a microphone 300, an A/D conversion system 302, digital signal processing (DSP) 304, a D/A conversion system 306, and a speaker 308. The components of the hearing aid of FIG. 18 are conventional and well understood, except that D/A conversion system 306 has been modified in accordance with the present invention. In the preferred embodiment, D/A conversion system 306 is an over-sampling D/A conversion system such as that shown in FIG. 4, where demodulator 69 has been replaced with the demodulator of FIG. 5. Delta sigma modulator 204 may be any of the delta sigma modulators described in this application, but preferably is one of the corrected feedback delta sigma modulators shown in FIGS. 8–12. Duty cycle demodulator 208 10 is preferably as shown in FIG. 6.

Figure 19:
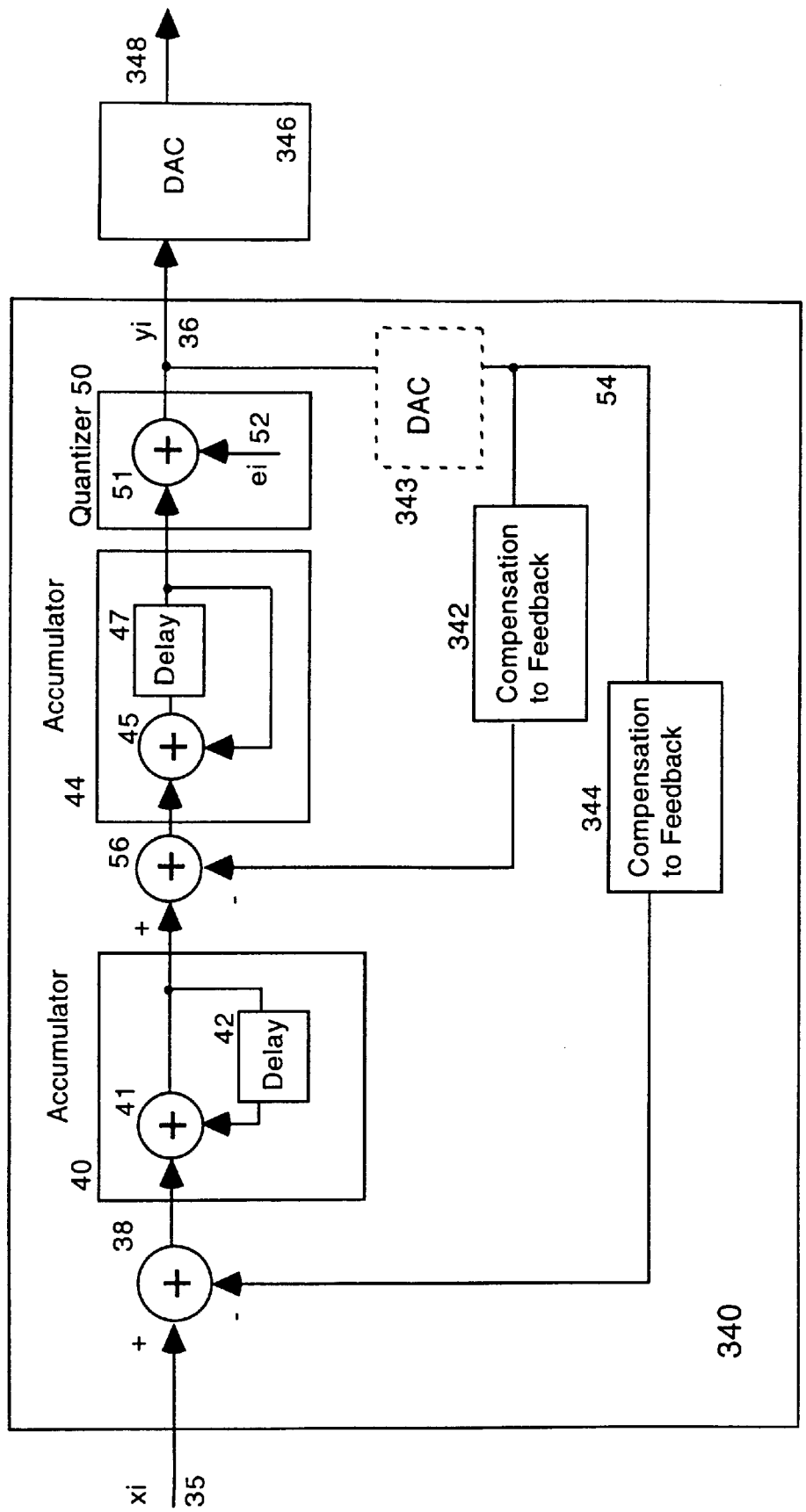
FIG. 19 shows second order delta sigma modulator, having feedback compensated for nonlinear variations in output data, according to a sixth embodiment of the present invention.

FIG. 19 shows a demodulator comprising a second order delta sigma modulator 340, and an output DAC 346. Second order delta sigma quantizer 340 is very similar to the prior art delta sigma modulator shown in FIG. 3, except that the feedback to each accumulator is compensated for nonlinear variations in output data. If there are time effects, such as pattern generation or slew rate issues, correction block 342 and correction block 344 must implement non-trivially different functions, to account for first and second order variations. For example, one loop may be corrected, but not the other. Or, each loop may be corrected in a different manner. A non-trivial difference is where one feedback function is not a simple linear function of the other.

Delta sigma modulator 340 may have a one bit or multilevel output. In the case of a multilevel delta sigma modulator 340, a multilevel quantizer 50 and matching multilevel DAC 346 are used. Multilevel DAC 343 in the feedback is also necessary. If delta sigma modulator 340 is one bit, quantizer 50 is two level, and DAC 346 is greatly simplified.

Figure 20:
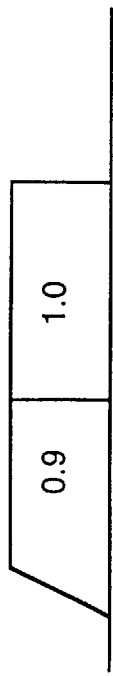
FIG. 20 shows a series of output pulses resulting from the embodiment of FIG. 19 having different rise times and areas.

For example, in the case where DAC 346 (one bit in this case) results in output data pulses resembling those in FIG. 20 due to slew rate limitations, correction block 344 accounts for the differences in area between first pulse 314 and second pulse 316. The area of first pulse 314 is (for example) 0.9 and the area of second pulse 316 is 1.0, so correction block 344 provides the integral, or area as a feedback. It is generally impracticable to generate two contiguous pulses having identical areas, because the first pulse has a rise time, whereas the second pulse is at its maximum value immediately. In addition to having different areas (first moment), pulses 314, 316 have different centers of gravity (second moment).

Correction block 342 accounts for the fact that the centers of gravity of pulses 314 and 316 are also not as predicted, and creates a signal based on the second integral of the output. It is noted that these two functions are not linear combinations of each other. This scheme can also be extended to higher order modulators, where each modulator receives (potentially) different feedback. It may be found to be adequate, for some applications, to use, for example, a fourth order modulator and only correct the second integrator.

Figure 21:
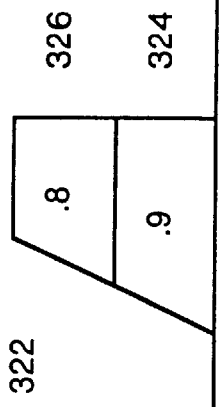
FIG. 21 shows a pulse of height two, resulting from the multilevel version of the embodiment of FIG. 19, illustrating that the pulse does not have the same center of gravity or double the area of a single pulse.

FIG. 21 shows a pulse 322 of height two, illustrating that the pulse does not have double the area of a single pulse 324. For the case where DAC 346 (multilevel in this case) results in output data pulses resembling those in FIG. 21, correction block 344 accounts for the differences in area between bottom pulse 324 and top pulse 326. The top half 326 of pulse 322 has less area than bottom half 324. Again, not only is the area different than the expected area, the center of gravity is different as well. FIG. 19 shows a system for correcting both of these imperfections in the output data. The area of bottom pulse 324 is (for example) 0.9 and the area of top pulse 326 is 0.8, so correction block 344 would feedback 0.9 for a "1" level, and 1.7 for a "2" level. Correction block 342 accounts for the fact that the center of gravity of combined pulse 322 is also not as predicted, and would create feedback based on the second integral.

Figure 22:
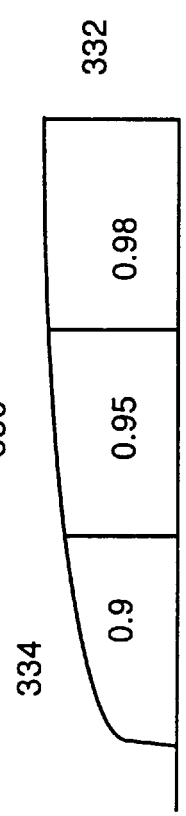
FIG. 22 shows a series of output pulses resulting from the embodiment of FIG. 19 having different rise times and areas.

FIG. 22 shows a series 332 of output pulses 334, 336, 338 having different rise times and areas. This figure is a more realistic depiction of a series of pulses than is FIG. 20. The rise time of these pulses is slow and nonlinear, so not only is the first pulse different from the second pulse, in both area and center of gravity, but the second pulse is different from the third.

For the case where DAC 346 (one bit in this case) results in output data pulses resembling those in FIG. 22, correction block 344, accounts for the differences in area between successive pulses 334, 336, 338. The area of first pulse 334 is (for example) 0.9, the area of second pulse 336 is 0.95, and the area of pulse 338 is 0.98, so correction block 344 produces a different value for all 3 pulses. It is required in cases such as that shown in FIG. 22 for correction block 344 to keep track of the history of output data 36 in order to adjust the correction factor depending upon the number of adjacent pulses it has seen. In contrast, correction of output data like that shown in FIG. 20 is simpler, because correction blocks 342 and 344 only need to monitor the changes in value. Again, the correction blocks for higher order stages would create the feedback for successively higher integrals of the output waveform. Block 342 would create the feedback correction for the second integral.

Figure 23:
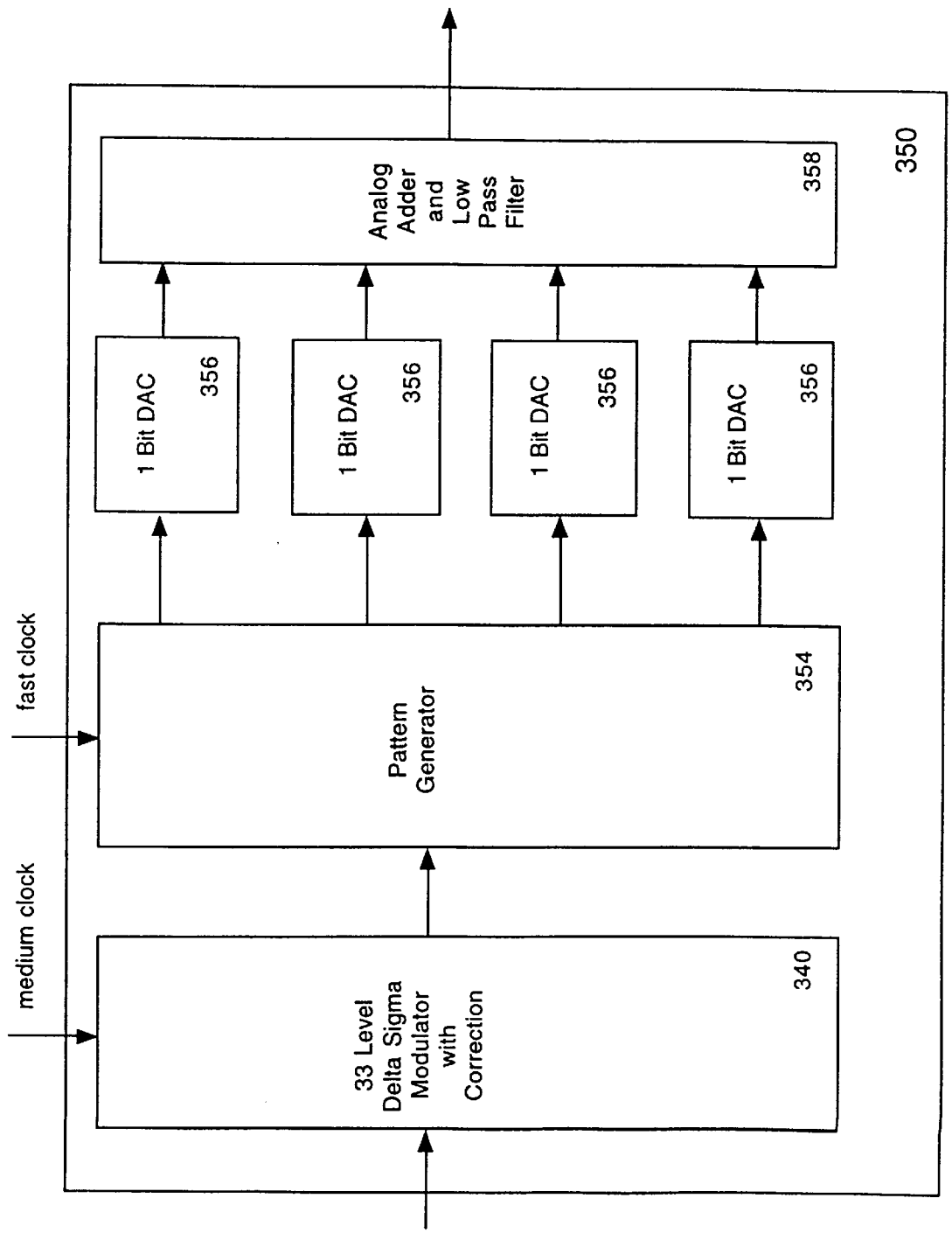
FIG. 23 shows a high quality, multilevel DAC utilizing the compensated delta sigma modulator of FIG. 19.

FIG. 23 shows another application in which the nonlinear output distortion correction of the present invention may be utilized. High quality delta sigma demodulator 340 comprises 33 level delta sigma modulator 352 connected to pattern generator 354, which feeds four output 1-bit DACs 356. Referring to FIG. 19, delta sigma modulator 340 is multilevel, with a 33 level quantizer 50 and further includes a 33 level DAC 343 in the feedback path 54. The four DAC outputs are summed and filtered in the analog domain in block 358.

Correction blocks 342 and 344 are utilized in this context to correct for the differences in the first and second moments of the generated patterns. In this case, 344 is (generally) a linear function, and 342 corrects for the time jitter caused by the patterns created.

Pattern generator 354 operates somewhat like a PWM with four outputs. The delta sigma modulator operates at a medium clock, and the pattern generator creates outputs at a fast clock rate.

The bit patterns out of pattern generator 354 are eight bits long, to implement the 33 level pattern. In this case, the fast clock is 8 times the frequency of the medium clock. The patterns are as follows:

| value out of modulator 340: | pattern out of pattern generator 354: |
|---|---|
| 0 | 00000000 |
|   | 00000000 |
|   | 00000000 |
|   | 00000000 |
| 1 | 00010000 |
|   | 00000000 |
|   | 00000000 |
|   | 00000000 |
| 2 | 00010000 |
|   | 00001000 |
|   | 00000000 |
|   | 00000000 |
| 3 | 00010000 |
|   | 00001000 |
|   | 00010000 |
|   | 00000000 |
| 4 | 00010000 |
|   | 00001000 |
|   | 00010000 |
|   | 00001000 |
| 5 | 00011000 |
|   | 00001000 |
|   | 00010000 |
|   | 00001000 |
| 6 | 00011000 |
|   | 00001000 |
|   | 00010000 |
|   | 00001000 |
| 7 | 00011000 |
|   | 00011000 |
|   | 00011000 |
|   | 00001000 |

-continued

| value out of modulator 340: | pattern out of pattern generator 354: |
|---|---|
| 8 | 00011000 |
|   | 00011000 |
|   | 00011000 |
|   | 00011000 |
| 9 | 00111000 |
|   | 00011000 |
|   | 00011000 |
|   | 00011000 |
| 10 | 00111000 |
|   | 00011100 |
|   | 00011000 |
|   | 00011000 |
| 32 | 11111111 |
|   | 11111111 |
|   | 11111111 |
|   | 11111111 |

Each of the four outputs from pattern generator 354 feeds a 1-bit DAC 356 (in the simplest case a wire). Generally the four outputs of DACs 356 are summed and passed through a low pass filter 358 to generate the final, cleaned up, output signal. Those skilled in that art will appreciate that many other patterns could be used, and many levels (for example, 256 levels) could be implemented. The second moment problem, and the calculation of the feedback values, is identical to that shown in the class D PWM example. Again, this technique can be extended to higher order delta sigma modulators.

Figure 24:
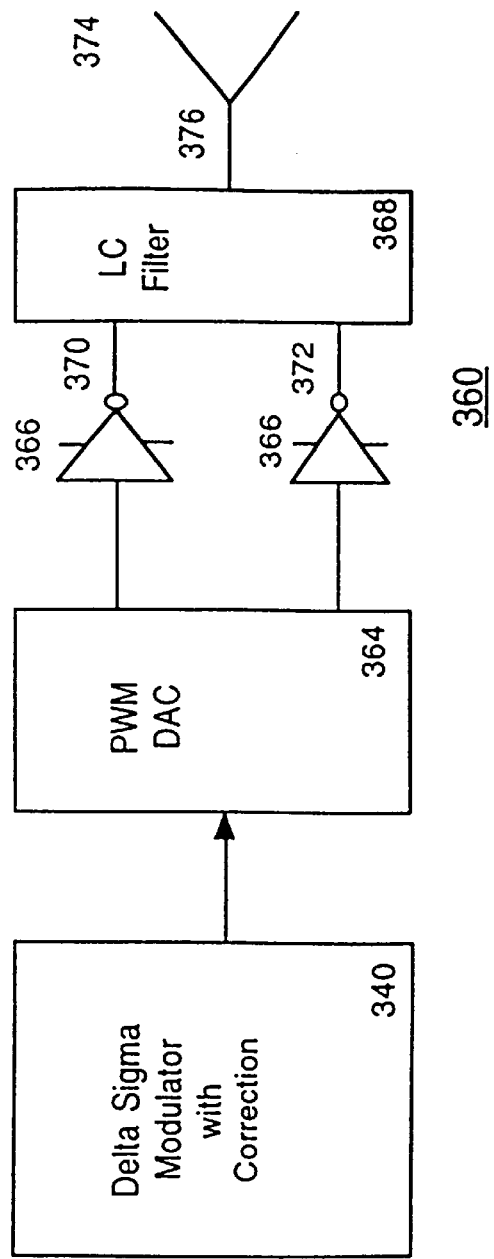
FIG. 24 shows a class D power amplifier utilizing the compensated delta sigma modulator of FIG. 19.

FIG. 24 is a block diagram of a class D power amplifier 360 utilizing delta sigma modulator 340 (shown in FIG. 19) with correction circuitry. Direct digital amplifiers like 360 drive tens to hundreds of volts at up to 50 amps. Delta sigma modulator 340 feeds a PWM DAC 364, which drives two amplifiers 366. Low pass filter 368 cleans up signals 370, 372 from amplifiers 366, and provides signal 376 driving to speaker 374.

Figure 25:
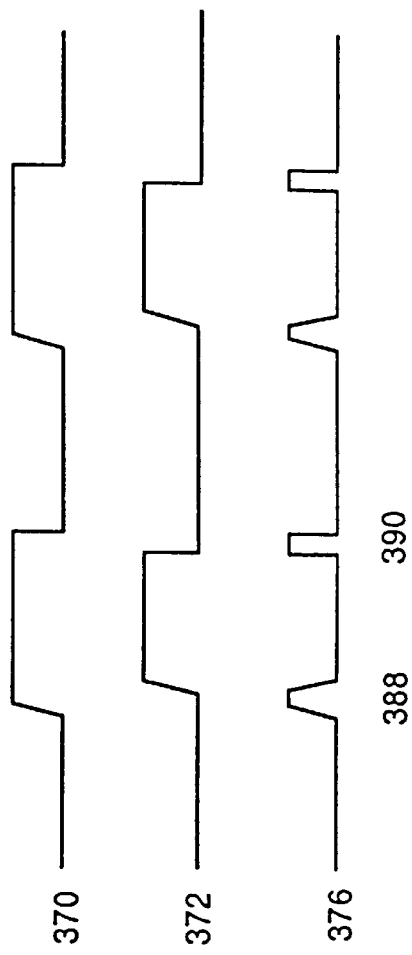
FIG. 25 shows a timing diagram of the embodiment of FIG. 24.

FIG. 25 illustrates why the correction circuitry of delta sigma modulator 340 is necessary. Signal 376 is the low passed difference of class D signals 370 and 372. In the real world, it is very difficult to achieve rise times that are as the same as fall times. Therefore, signal pulse 388 is effectively later than signal pulse 390 (though they have the same area). This a slew rate problem similar to those shown in FIGS. 20–22 and discussed above. The first moments of the two pulses, in this case, are identical, but the second moments differ, and these errors are corrected for by the correction circuitry of delta sigma modulator 340.

Those skilled in the art will appreciate that higher order delta sigma quantizers having additional distinct correction block(s) in the feedback for the additional accumulator(s) could be used to compensate for higher order distortions in the output data (third moment and up). While distortions caused by several output configurations have been used as examples of distortions that can be corrected by the present scheme, any systemic, predictable distortions of the output data can be similarly accounted for.

Functions implemented by correction blocks 342, 344 must be nontrivially different in order to compensate for nonlinear distortion. One example might be implementation of a square law. Correction blocks 342, 344 might be implemented as lookup tables or logic implementing mathematical expressions.

While the exemplary preferred embodiments of the present invention are described herein with particularity, those skilled in the art will appreciate various changes, additions, and applications other than those specifically mentioned, which are within the spirit and scope of this invention.

What is claimed is:

1. A compensated delta sigma modulator of at least second order, having at least first and second feedback loops carrying an original feedback signal and further comprising:

means for selecting a first corrected feedback, based upon the original feedback, to be applied to the first feedback loop;

means for applying the first corrected feedback to the first feedback loop;

means for selecting a second corrected feedback, based upon the original feedback, to be applied to the second feedback loop; and means for applying the second corrected feedback to the second feedback loop;

wherein the first corrected feedback is nontrivially different from the second corrected feedback.

2. The compensated delta sigma modulator of claim 1 wherein the first corrected feedback is a linear function of the original feedback signal, and the second corrected feedback is a nonlinear function of the original feedback.

3. The compensated delta sigma modulator of claim 1 wherein the first corrected feedback is the original feedback signal, and the second corrected feedback is a nonlinear function of the original feedback.

4. The compensated delta sigma modulator of claim 1 configured to generate a one bit output signal.

5. The compensated delta sigma modulator of claim 1 configured to generate a multilevel output signal.

6. A demodulator comprising:

a compensated delta sigma modulator of at least second order, having at least first and second feedback loops carrying an original feedback signal and further comprising:

means for selecting a first corrected feedback, based upon the original feedback, to be applied to the first feedback loop;

means for applying the first corrected feedback to the first feedback loop;

means for selecting a second corrected feedback, based upon the original feedback, to be applied to the second feedback loop; and means for applying the second corrected feedback to the second feedback loop;

wherein the first corrected feedback is nontrivially different from the second corrected feedback; and a digital to analog converter connected to the output of the modulator for generating an analog output.

7. The demodulator of claim 6 configured to generate a one bit output signal.

8. The demodulator of claim 6 configured to generate a multilevel output signal.

9. A high quality digital to analog converter comprising:

a compensated multilevel delta sigma modulator of at least second order, having at least first and second feedback loops carrying an original feedback signal and outputting a multilevel output signal and further including:

means for selecting a first corrected feedback, based upon the original feedback, to be applied to the first feedback loop, means for applying the first corrected feedback to the first feedback loop, means for selecting a second corrected feedback, based upon the original feedback, to be applied to the second feedback loop, and means for applying the second corrected feedback to the second feedback loop;

wherein the first corrected feedback is nontrivially different from the second corrected feedback; and a pattern generator connected to the output of the modulator, including means for generating a plurality of two level output signals having patterns based upon the multilevel output of the modulator.

10. The high quality digital to analog converter of claim 9, further including:

a plurality of output one bit digital to analog converters connected to the plurality of output signals from the pattern generator and generating a plurality of one bit output signals; and an analog adder for filtering and adding the one bit output signals to form a combined analog output signal.

11. The high quality digital to analog converter of claim 10, wherein the compensated multilevel delta sigma modulator operates at a medium clock rate and the pattern generator operates at a fast clock rate.

12. A class D output power amplifier comprising:

a compensated delta sigma modulator of at least second order, having at least first and second feedback loops carrying an original feedback signal and outputting an output signal and further including:

means for selecting a first corrected feedback to be applied to the first feedback loop, means for applying the first corrected feedback to the first feedback loop, means for selecting a second corrected feedback, to be applied to the second feedback loop, and means for applying the second corrected feedback to the second feedback loop;

wherein the first corrected feedback is nontrivially different from the second corrected feedback; and a pulse wave modulator digital to analog converter connected to the output of the compensated delta sigma modulator for generating two analog signals P and N based on the output signal from the compensated delta sigma modulator.

13. The amplifier of claim 12, further comprising:

a speaker filter for generating the filtered signal P-N; and a speaker amplifier for turning the signal P-N into an audio signal.

* * * * *

UNITED STATES PATENT AND TRADEMARK OFFICE
CERTIFICATE OF CORRECTION

Figure 1:
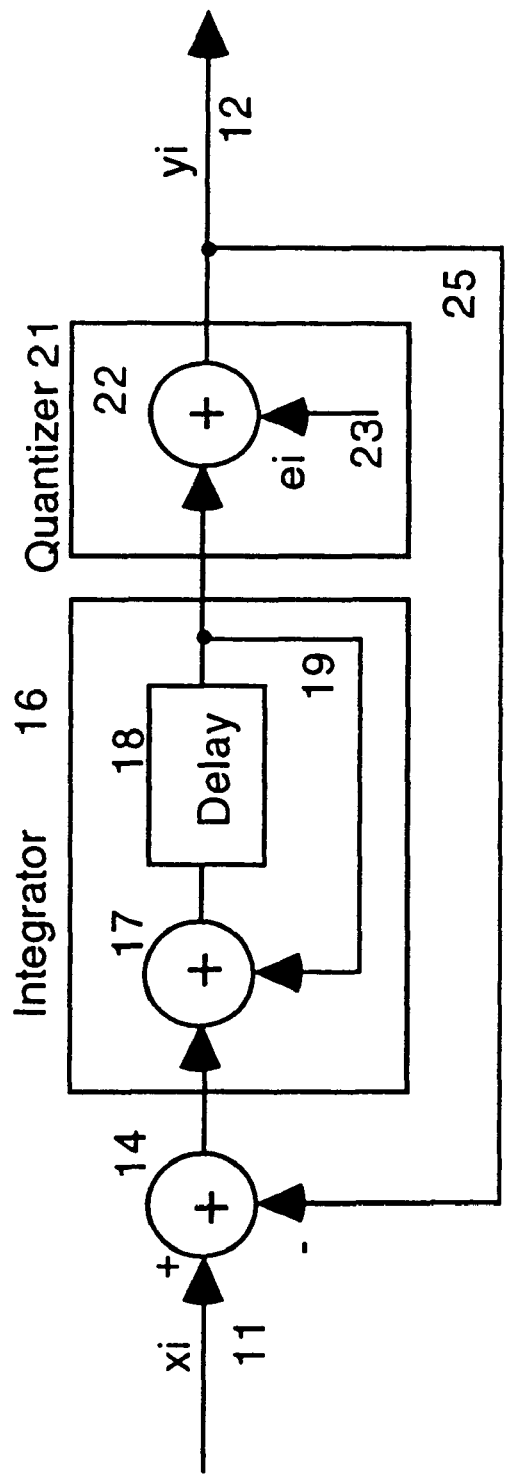
FIG. 1 (prior art) shows a well known first order delta sigma quaritizer.
Figure 2:
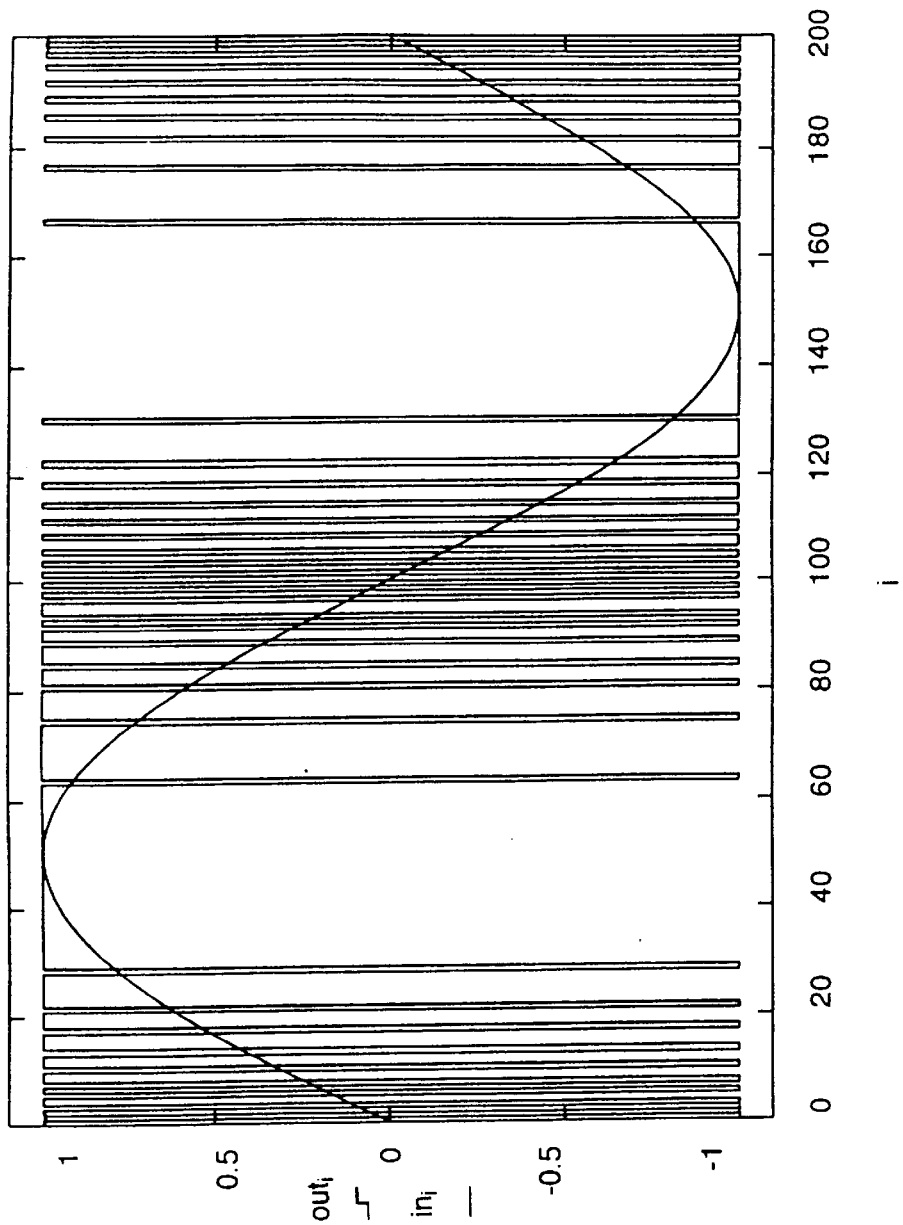

PATENT NO. : 6,150,969
DATED : November 21, 2000
INVENTOR(S) : John Laurence Melanson It is certified that error appears in the above-identified patent and that said Letters Patent is hereby corrected as shown below:

Column 4, line 65, After "the" insert --quantizer of FIG. 1--;

Column 7, line 19, delete "This" and insert --Thus--;

Column 10, line 19, delete "date" and insert --data--;

Column 10, line 50, delete "1216" insert --126--;

Column 10, line 57, delete "14.3" insert --143--; and

Column 11, line 61, delete "20810" insert --208--.

Signed and Sealed this

Eighth Day of May, 2001

*Attest:*

NICHOLAS P. GODICI

*Attesting Officer*   *Acting Director of the United States Patent and Trademark Office*